(12) United States Patent
Muroshima

(10) Patent No.: US 8,710,421 B2
(45) Date of Patent: Apr. 29, 2014

(54) SOLID-STATE IMAGING DEVICE AND IMAGING APPARATUS

(75) Inventor: Takahiro Muroshima, Kyoto (JP)

(73) Assignee: Panasonic Corporation, Osaka (JP)

( * ) Notice: Subject to any disclaimer, the term of this patent is extended or adjusted under 35 U.S.C. 154(b) by 188 days.

(21) Appl. No.: 13/475,158

(22) Filed: May 18, 2012

(65) Prior Publication Data

US 2012/0228476 A1   Sep. 13, 2012

Related U.S. Application Data

(63) Continuation of application No. PCT/JP2010/005316, filed on Aug. 30, 2010.

(30) Foreign Application Priority Data

Nov. 26, 2009   (JP) ................................. 2009-269344

(51) Int. Cl.
  *H01L 27/00* (2006.01)
  *H01J 40/14* (2006.01)
  *H01L 27/146* (2006.01)

(52) U.S. Cl.
  CPC ..... *H01L 27/14609* (2013.01); *H01L 27/14643* (2013.01)
  USPC .................................... 250/208.1; 250/214 R

(58) Field of Classification Search
  CPC .................. H01L 27/14643; H01L 27/14609; H04N 3/155; G01J 1/44; G01J 1/32; G01J 1/46; H01J 40/14; H03F 3/08; Y02E 10/50
  USPC .................. 250/208.1, 214.1, 214 R, 214 DC
  See application file for complete search history.

(56) References Cited

U.S. PATENT DOCUMENTS 7,515,185 B2   4/2009   Nakamura et al.
(Continued)

FOREIGN PATENT DOCUMENTS

JP         11-112850        4/1999
(Continued)

OTHER PUBLICATIONS

International Search Report issued Sep. 28, 2010 in International Application No. PCT/JP2010/005316.

*Primary Examiner* — Pascal M Bui Pho
(74) *Attorney, Agent, or Firm* — Wenderoth, Lind & Ponack, L.L.P.

(57) ABSTRACT

A solid-state imaging device according to the present invention includes a pixel cell having a photodiode, a charge detection unit, an amplification transistor, a transfer transistor which transfers a signal charge to the charge detection unit in accordance with a transfer control signal, and a reset transistor which resets the charge detection unit in accordance with a reset control signal; a signal processing circuit which receives a pixel reset potential of the charge detection unit, and a pixel signal potential corresponding to the signal charge transferred to the charge detection unit; a charge pump circuit which steps up or steps down a potential of at least one of the transfer control signal and the reset control signal in accordance with a driving clock signal; and a control logic circuit which causes the driving clock signal to be stopped during a pixel reading time period.

11 Claims, 15 Drawing Sheets

(56) References Cited

U.S. PATENT DOCUMENTS

| | | |
|---|---|---|
| 7,709,777 B2 | 5/2010 | Rhodes |
| 2004/0252211 A1 | 12/2004 | Rhodes |
| 2005/0224841 A1 | 10/2005 | Nakamura et al. |
| 2006/0001754 A1 | 1/2006 | Yanagisawa et al. |
| 2007/0058057 A1* | 3/2007 | Futamura ............... 348/294 |
| 2010/0258709 A1 | 10/2010 | Rhodes |

FOREIGN PATENT DOCUMENTS

| | | |
|---|---|---|
| JP | 2000-209508 | 7/2000 |
| JP | 2004-241491 | 8/2004 |
| JP | 2006-019971 | 1/2006 |
| JP | 2006-527973 | 12/2006 |
| JP | 2009-182349 | 8/2009 |
| WO | 2004/114652 | 12/2004 |

* cited by examiner

SOLID-STATE IMAGING DEVICE AND IMAGING APPARATUS

CROSS REFERENCE TO RELATED APPLICATION

This is a continuation application of PCT Patent Application No. PCT/JP2010/005316 filed on Aug. 30, 2010, designating the United States of America, which is based on and claims priority of Japanese Patent Application No. 2009-269344 filed on Nov. 26, 2009. The entire disclosures of the above-identified applications, including the specifications, drawings and claims are incorporated herein by reference in their entirety.

TECHNICAL FIELD

The present invention relates to a solid-state imaging device and an imaging apparatus.

BACKGROUND ART

A MOS solid-state imaging device is generally used as an amplification type solid-state imaging device. The MOS solid-state imaging device includes a pixel section having a plurality of pixel cells which each generate a signal Embodiment 1 according to an amount of received light; a scanning circuit disposed around the pixel section; and a signal processing circuit, where the scanning circuit is configured to read a signal potential from the pixel section.

A solid-state imaging device is known in which a charge pump circuit is formed on a semiconductor substrate on which a MOS solid-state imaging device is disposed, in order to generate a potential higher than the power source potential, or a potential lower than the GND potential.

Japanese Unexamined Patent Application Publication No. 2004-241491 discloses a solid-state imaging device which includes a charge pump step-up circuit for generating a potential higher than the power source potential. FIG. 15A is a block diagram of the conventional charge pump step-up circuit disclosed in Japanese Unexamined Patent Application Publication No. 2004-241491. FIG. 15B is a timing chart illustrating the operation of the charge pump step-up circuit illustrated in FIG. 15A.

As illustrated in FIG. 15A, a conventional charge pump step-up circuit 20a includes a pump unit 201a which charges or discharges a pump capacitor in order to generate a potential higher than the power source potential; a comparator 202a which determines whether or not a potential Vh generated by the pump unit 201a has reached a desired potential; and a resistor potential divider circuit 203a which generates a divided output potential of the charge pump step-up circuit which can be compared by the comparator 202a.

The charge pump step-up circuit 20a configured in the above manner is driven by a PMPCLK signal which is generated by a clock generator (CLK generator) 22. The electric charge generated by the charge pump step-up circuit 20a is distributed by a smoothing capacitive element 21a so as to stabilize the output potential Vh. Then as illustrated in FIG. 15B, when the output potential Vh of the charge pump step-up circuit 20a reaches a desired potential, the comparator 202a sets a PMPEN signal to Low, which is an enable signal of the pump unit 201a, thereby causing a PMPCLKi signal inputted to the pump unit 201a to be stopped, and thus the operation of the pump unit 201a is stopped. On the other hand, when the output potential Vh of the charge pump step-up circuit 20a falls below the desired potential, the comparator 202a sets the PMPEN signal to Hi, thereby causing the operation of the pump unit 201a to resume. As illustrated in FIG. 15B, the output potential Vh of the charge pump step-up circuit 20a fluctuates up or down from the desired potential in accordance with the frequency characteristic of a feedback circuit including the resistor potential divider circuit 203a and the comparator 202a of the charge pump step-up circuit 20a.

A charge pump step-down circuit for generating a potential lower than the GND potential has a similar configuration to that of the charge pump step-up circuit 20a. FIG. 16 is a block diagram of a conventional charge pump step-down circuit.

As illustrated in FIG. 16, the conventional charge pump step-down circuit 20b includes a pump unit 201b which charges or discharges a pump capacitor; a comparator 202b which determines whether or not a potential Vl generated by the pump unit 201b has reached a desired potential; and a resistor potential divider circuit 203b which generates a divided output potential of the charge pump step-down circuit which can be compared by the comparator 202b.

The conventional charge pump step-down circuit 20b operates similarly to the conventional charge pump step-up circuit 20a, and the output potential Vl of the charge pump step-down circuit 20b fluctuates up or down from the desired potential. The electric charge generated by the charge pump step-down circuit 20b is distributed by a smoothing capacitive element 21b so as to stabilize the output potential Vl.

CITATION LIST

Patent Literature

Japanese Unexamined Patent Application Publication No. 2004-241491

SUMMARY OF INVENTION

Technical Problem

The relationship between the operation of the above-described conventional charge pump step-up circuit 20a and a pixel reading time period is described with reference to FIG. 17. FIG. 17 is a timing chart illustrating the operation of a charge pump step-down circuit in a pixel reading time period and a signal processing time period in a conventional solid-state imaging device. In FIG. 17, Vh is the output potential of the charge pump step-up circuit, Vhh indicates the upper limit potential of the fluctuation in the output of the charge pump step-up circuit, and Vhl indicates the lower limit potential thereof. The PMPCLK signal, the PMPEN signal, and the PMPCLKi signal correspond to respective signals illustrated in FIG. 15A.

As described above, in the conventional charge pump step-up circuit 20a, the operation time period is determined by the output potential of the charge pump step-up circuit 20a, and thus the operation time period of the charge pump step-up circuit and the pixel reading time period of the solid-state imaging device are asynchronous. Therefore, as illustrated in FIG. 17, the operation time period of the charge pump step-up circuit in the pixel read period is different for each row of pixels to be read, and the range of the fluctuation of Vh also varies for each row of pixels to be read.

Similarly, in the conventional charge pump step-down circuit 20b illustrated in FIG. 16, the operation time period of the charge pump step-down circuit 20b is different for each row of pixels to be read, and the range of the fluctuation of the output potential Vl also varies for each row of pixels to be read.

Now, in each pixel constituting the solid-state imaging device, there is a parasitic capacitance between a driving signal line for driving a transistor and a charge detection unit FD.

Therefore, in a solid-state imaging device which uses the output potential of a charge pump step-up circuit or a charge pump step-down circuit as a driving signal of the transistors in a pixel, the charge pump step-up circuit or the charge pump step-down circuit operates asynchronously to a pixel driving signal as described above, and thus the range of the fluctuation of the output potential varies for each row to be read. Therefore, for each row to be read, a different offset voltage is applied to the charge detection unit FD, and is transmitted to the output of the pixel. Consequently, there is a problem in that random horizontal line noise occurs in an output image of the solid-state imaging device.

In general, the smaller the size of a pixel cell is, the more difficult it is to maintain a high ratio of a partial amount of light that is guided to the photodiode with respect to the light that is emitted from the outside of a solid-state imaging device, i.e., an external quantum efficiency. As a measure for solving the above problem, microscopic transistors in the pixel and low height wiring layers on the substrates of the semiconductors forming the pixel have been developed. However, a junction capacitor and a gate capacitance tend to be reduced due to microscopic transistors, and a wiring capacity tends to be increased due to low height wiring layers, and thus the effect of the fluctuation in the potential of signal lines on the charge detection unit FD tends to increase. Therefore, random horizontal line noise caused by the above-described charge pump step-up circuit or charge pump step-down circuit appears more significantly in the output image, and thus the quality of the output image further deteriorates.

On the other hand, as another approach to increase the external quantum efficiency, back-side illuminated solid-state imaging devices are being practically used, in which light is irradiated on the rear surface of the semiconductor substrate, i.e., the surface opposite to the surface on which transistors and wiring are formed. In the back-side illuminated solid-state imaging device, no light needs to be inputted to the surface on which transistors and wiring are formed, and thus a design rule is relatively loose, and an inexpensive wiring process is often used. However, in the back-side illuminated solid-state imaging device, the wiring capacity increases on the contrary, and random horizontal line noise caused by the charge pump step-up circuit or charge pump step-down circuit is likely to occur.

The present invention has been made in order to solve the above-mentioned problem, and it is an object of the invention to provide a solid-state imaging device and an imaging apparatus in which random horizontal line noise caused by a fluctuation in the output potential of the charge pump circuit is suppressed by adding a simple circuit, while satisfying the demand of improving the external quantum efficiency.

Solution to Problem

In order to solve the above-mentioned problem, one aspect of the present invention is an imaging device including: a pixel cell having: light receiving unit configured to convert incident light to a signal charge, charge detection unit configured to convert, to a signal voltage, the signal charge transferred from the light receiving unit, an amplification transistor which amplifies the signal voltage, a transfer transistor which transfers, to the charge detection unit, the signal charge accumulated in the light receiving unit, in accordance with a transfer control signal, and a reset transistor which resets a potential of the charge detection unit to a reset potential in accordance with a reset control signal; a signal processing circuit which receives a pixel reset potential corresponding to the reset potential of the charge detection unit, and a pixel signal potential corresponding to the signal charge transferred to the charge detection unit; a charge pump circuit which steps up or steps down a potential of at least one of the transfer control signal and the reset control signal in accordance with a driving clock signal; and a control circuit which causes the driving clock signal to be stopped during a pixel reading time period in which the reset potential and the pixel signal potential are read.

With this configuration, the operation of the charge pumping circuit can be stopped during the pixel reading time period, and thus random horizontal line noise caused by a fluctuation in the output potential of the charge pump circuit can be suppressed.

In one aspect of the present invention, it is preferable that the charge pump circuit steps up the potential of at least one of the transfer control signal and the reset control signal to a potential higher than a power source potential.

In one aspect of the present invention, it is preferable that the pixel cell further includes a selection transistor which selects a pixel cell to be read, in accordance with a selection control signal, and the charge pump circuit steps up a potential of the selection control signal.

In one aspect of the present invention, it is preferable that the imaging device further includes a capacitive element connected to an output of the charge pump circuit.

In one aspect of the present invention, it is preferable that the charge pump circuit steps down the potential of at least one of the transfer control signal and the reset control signal to a potential lower than a ground potential.

In one aspect of the present invention, it is preferable that the pixel cell further includes a selection transistor which selects a pixel cell to be read, in accordance with a selection control signal, and the charge pump circuit steps down a potential of the selection control signal.

In one aspect of the present invention, it is preferable that the imaging device further includes a capacitive element connected to an output of the charge pump circuit.

In one aspect of the present invention, it is preferable that the pixel reading time period is a time period in which the pixel cell is selected by the selection transistor.

In one aspect of the present invention, it is preferable that the control circuit causes the driving clock signal to be stopped in a time period including a time interval from a time when the signal processing circuit receives the pixel reset potential to a time when the signal processing circuit receives the pixel signal potential.

In one aspect of the present invention, it is preferable that the imaging device further includes a frequency multiplier circuit or a frequency divider circuit, wherein the driving clock signal is generated by the frequency multiplier circuit or the frequency divider circuit.

One aspect of the present invention is an imaging apparatus including a solid-state imaging device according to the present invention.

Advantageous Effects of Invention

According to the solid-state imaging device or the imaging apparatus in the present invention, the control circuit causes the driving clock signal of the step-up circuit or the step-down circuit to be stopped during each pixel reading time period. Accordingly, while the driving clock signal is stopped, the operation of the step-up circuit or the step-down circuit can be stopped, and thus the fluctuation in the output potential of the step-up circuit of the step-down circuit in the pixel reading time period can be prevented from being varied for each row of pixels to be read. Therefore, an offset voltage applied to the charge detection unit FD by the parasitic capacitance between the signal lines for driving the transistors in a pixel cell and the charge detection unit FD can be prevented from being varied for each row to be read. Consequently, random horizontal line noise caused by a fluctuation in the output voltage of the step-up circuit or the step-down circuit during each pixel reading time period can be suppressed, and thus a high quality image can be obtained.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings:

FIG. 1 is a diagram illustrating the pixel configuration of a solid-state imaging device according to Embodiment 1 of the present invention;

FIG. 2 is a diagram schematically illustrating the overall configuration of the solid-state imaging device according to Embodiment 1 of the present invention;

FIG. 3 is a diagram illustrating the overall configuration of the solid-state imaging device according to Embodiment 1 of the present invention;

FIG. 4A is diagram illustrating the circuit configuration of a charge pump step-up circuit in the solid-state imaging device according to Embodiment 1 of the present invention;

FIG. 4B is a diagram illustrating the circuit configuration of a charge pump step-down circuit in the solid-state imaging device according to Embodiment 1 of the present invention;

FIG. 5 is a timing chart of a conventional solid-state imaging device using a charge pump step-up circuit;

FIG. 6 is a timing chart of the solid-state imaging device according to Embodiment 1 of the present invention, in which a charge pump step-up circuit is used;

FIG. 7 is a timing chart of a conventional solid-state imaging device using a charge pump step-down circuit;

FIG. 8 is a timing chart of the solid-state imaging device according to Embodiment 1 of the present invention, in which a charge pump step-down circuit is used;

FIG. 9 is a diagram illustrating the pixel configuration of a solid-state imaging device according to a modification of Embodiment 1 of the present invention;

FIG. 10 is a timing chart of a solid-state imaging device according to Embodiment 2 of the present invention, in which a charge pump step-up circuit is used;

FIG. 11 is a diagram illustrating the overall configuration of a solid-state imaging device according to Embodiment 3 of the present invention;

FIG. 12 is a timing chart of a conventional solid-state imaging device using a charge pump step-down circuit;

FIG. 13 is a timing chart of a solid-state imaging device according to Embodiment 3 of the present invention, in which a charge pump step-down circuit is used;

FIG. 14 is a block diagram illustrating the configuration of an imaging device according to Embodiment 4 of the present invention;

FIG. 15A is the block diagram of the conventional charge pump step-down circuit disclosed in Japanese Unexamined Patent Application Publication No. 2004-241491;

FIG. 15B is a timing chart illustrating the operation of the charge pump step-down circuit shown in FIG. 15A;

FIG. 16 is a block diagram of a conventional charge pump step-down circuit; and

FIG. 17 is a timing chart illustrating the operation of a charge pump step-down circuit in a pixel reading time period and a signal processing time period in a conventional solid-state imaging device.

DESCRIPTION OF EMBODIMENTS

Hereinafter, a solid-state imaging device and an imaging apparatus according to an embodiment of the present invention will be described with reference to the drawings.

Embodiment 1

Figure 1:
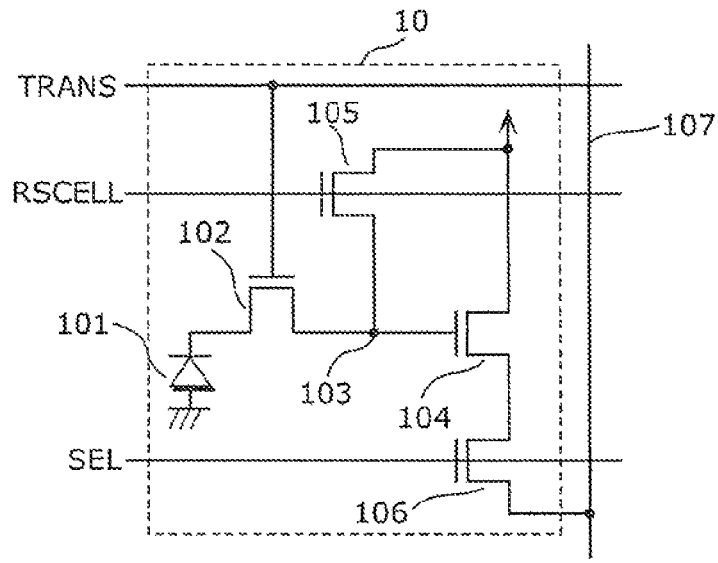
[FIG. 1]

First, a solid-state imaging device according to Embodiment 1 of the present invention is described. FIG. 1 is a diagram illustrating the pixel configuration of the solid-state imaging device according to Embodiment 1 of the present invention.

The solid-state imaging device according to Embodiment 1 of the present invention includes a plurality of pixel cells, and, as illustrated in FIG. 1, each pixel cell 10 includes a photodiode 101 as a photoelectric conversion unit (light receiving unit) which converts incident light to a signal charge; a charge detection unit FD (floating diffusion) 103 for converting a signal charge to a signal voltage, the signal charge being accumulated in the photodiode 101 and transferred therefrom; a transfer transistor 102 for transferring the signal charge accumulated in the photodiode 101 to the charge detection unit FD103; an amplification transistor 104 for amplifying the potential of the charge detection unit FD103; and a reset transistor 105 for resetting the potential of the charge detection unit FD103 to a reset potential. The solid-state imaging device further includes a selection transistor 106 for selecting a specific pixel cell so that a signal potential amplified by the amplification transistor 104 in as the specific pixel is outputted to a vertical signal line 107 in common. A pixel cell to be read is selected by the selection transistor 106. In the solid-state imaging device according to Embodiment 1 of the present invention, the pixel cells configured in the above manner are arranged in a matrix form and the vertical signal line 107 is shared by the pixel cells in each column.

It should be noted that a unit pixel cell illustrated in FIG. 1 has what is called one pixel per cell structure in which the photodiode (light receiving unit) 101, the transfer transistor 102, the charge detection unit FD (floating diffusion) 103, the reset transistor 105, and the amplification transistor 104 are each included in the unit pixel cell. However, the structure of the unit pixel cell is not limited to the above structure. For example, what is called multiple pixels per cell structure may be adopted in which the unit pixel cell includes a plurality of light receiving units, and either one or all of the floating diffusion, the reset transistor and the amplification transistor are shared within the unit cell.

A structure may be adopted in which the photodiode (light receiving unit) 101 of FIG. 1 is formed on the surface of the semiconductor substrate, i.e., the surface on which the gates of the transistors and wiring are disposed. Alternatively, the structure of what is called a rear-surface irradiation type image sensor (back-side illuminated solid-state imaging device) may be used, in which the photodiode (light receiving unit) is formed on the surface opposite to the surface on which the gates of the transistors and wiring are disposed.

In order to improve the characteristics of the pixels, Hi potential of the drive pulse for driving the pixel cells may be set to a potential higher than the power source potential, and Low potential may be set to a potential lower than the GND potential. For example, for the case of the drive potential of the pixel cell 10, Hi potential of a TRANS signal which turns on the transfer transistor 102 is set to a potential higher than the power source potential in order to completely transfer the electric charge generated by the photodiode 101 to the charge detection unit FD103. Low potential of the TRANS signal which turns off the transfer transistor 102 is set to a potential lower than the GND potential in order to suppress a signal deterioration due to a dark current. By assigning a voltage higher than the power source potential to Hi potential of a RSCELL signal for turning on the reset transistor 105 which resets the charge detection unit FD103, the potential of the charge detection unit FD103 at the time of reset is reduced, and thus the dynamic range in the charge detection unit FD can be expanded. By assigning a potential higher than the power source potential to Hi potential of a SEL signal which turns on the selection transistor 106, the on-resistance of the selection transistor 106 can be reduced, and the response speed of the pixel can be increased.

Figure 2:
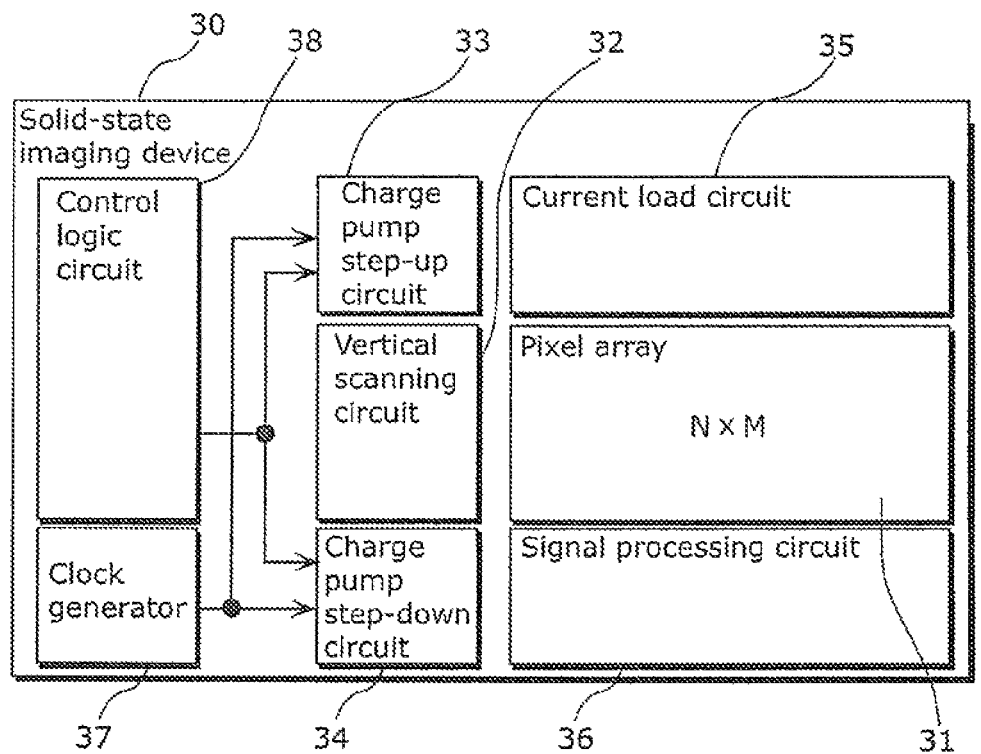
[FIG. 2]

Next, the overall configuration of the solid-state imaging device according to Embodiment 1 of the present invention will be described with reference to FIG. 2. FIG. 2 is a diagram schematically illustrating the overall configuration of the solid-state imaging device according to Embodiment 1 of the present invention.

As illustrated in FIG. 2, the solid-state imaging device 30 according to Embodiment 1 of the present invention includes a pixel array section 31 in which the pixel cell as illustrated in FIG. 1 is arranged in a matrix with N rows and M columns (N×M); a vertical scanning circuit 32 for driving a selected pixel row; a charge pump step-up circuit 33 for generating a potential higher than the power source voltage for driving each pixel row of the pixel array section 31; a charge pump step-down circuit 34 for generating a potential lower than the GND potential for driving each pixel row; a clock generator (CLK generator) 37 which generates driving clock signals for driving the charge pump step-up circuit 33 and the charge pump step-down circuit 34; and a signal processing circuit 36 which performs CDS (Correlated Double Sampling) on a current load circuit 35 disposed for each pixel row and pixel signals read from the pixel cells in the pixel array section 31. The solid-state imaging device 30 further includes a control logic circuit (control circuit) 38 for causing the driving clock signal of the clock generator 37 to be stopped during each pixel reading time period in which the potentials in the pixel cells are read.

Figure 3:
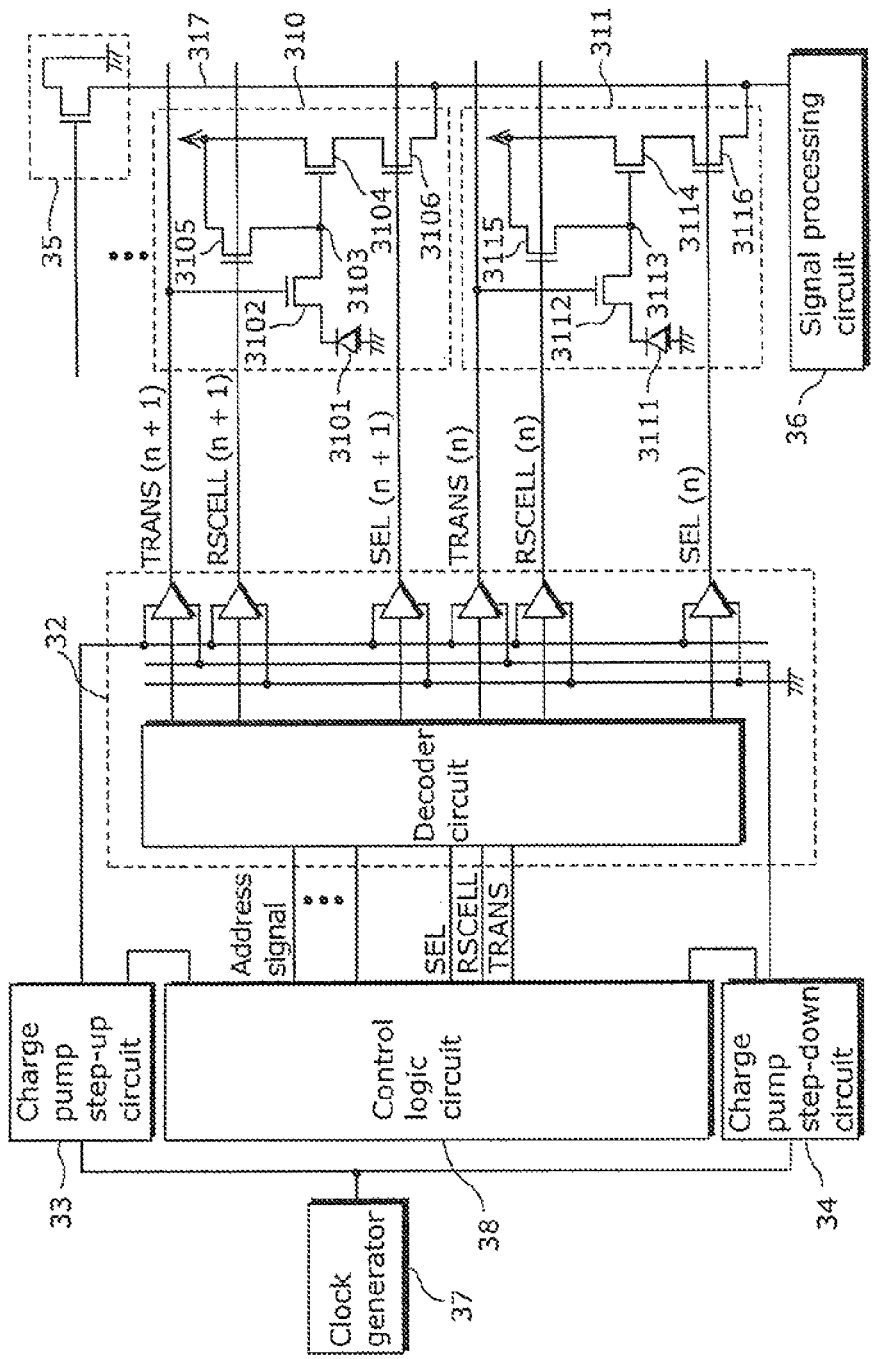
[FIG. 3]

Next, the solid-state imaging device 30 according to Embodiment 1 of the present invention illustrated in FIG. 2 will be described in detail with reference to FIG. 3. FIG. 3 is a diagram illustrating the overall configuration of the solid-state imaging device according to Embodiment 1 of the present invention. It should be noted that only two pixel cells in an arbitrary pixel row are illustrated in the pixel array section illustrated in FIG. 3.

As illustrated in FIG. 3, similarly to FIG. 1, a pixel cell 310 formed in the pixel array section includes a photodiode 3101 as a photoelectric conversion unit; a charge detection unit FD3103 for converting a signal charge to a signal voltage the signal charge being transferred from the photodiode 3101; a transfer transistor 3102 for transferring the signal charge accumulated in the photodiode 3101 to the charge detection unit FD3103; an amplification transistor 3104 for amplifying the signal voltage of the charge detection unit FD3103; a reset transistor 3105 for resetting the potential of the charge detection unit FD3103 to a reset potential; and a selection transistor 3106 for selecting a specific pixel cell in a pixel row in order to output the pixel signals in the pixel row effective to a vertical signal line 317 shared by each column.

Similarly, a pixel cell 311 includes a photodiode 3111 as a photoelectric conversion unit, a charge detection unit FD3113, a transfer transistor 3112, an amplification transistor 3114, a reset transistor 3115, and a selection transistor 3116.

The output of the pixel cells in the same column is connected to the vertical signal line 317 in common. In the present embodiment, the output of the selection transistor of each pixel cell is connected to the vertical signal line 317. It should be noted that the vertical signal line 317 may be referred to as a column signal line.

The vertical signal lines 317 of the pixel rows are connected to respective current load circuits 35, and the amplification transistor of each pixel cell, for example, the amplification transistors 3104, 3114 of the pixel cells 310, 311, and the current load circuit 35 together constitute a source follower amplifier.

In addition, the vertical signal line 317 is connected to the as signal processing circuit 36 for each pixel row.

During each pixel reading time period in which the potentials in the pixel cells are read, the signal processing circuit 36 receives a pixel output potential (pixel reset potential) corresponding to the reset time of the charge detection units FD3103, 3113, and a pixel output potential (pixel signal potential) according to the electric charge transferred from the photodiodes 3101, 3111 to the charge detection units FD3103, 3113, and performs CDS (Correlated Double Sampling) processing. A difference between the pixel reset potential and the pixel signal potential is obtained as a pixel signal according to incident light by the CDS processing.

The vertical scanning circuit 32 has a decoder circuit and a driver; and the address signals corresponding to the pixel rows to be driven, and the SEL signal, the RSCELL signal, and the TRANS signal which are driving pulse signals for driving selected pixel rows are supplied from the control logic circuit 38 described below, while predetermined output potentials are supplied from the charge pump step-up circuit 33 and the charge pump step-down circuit 34 so that the SEL signal (selection control signal), the RSCELL signal (reset control signal) and the TRANS signal (transfer control signal) for driving selected predetermined lines are outputted. It should be noted that the vertical scanning circuit 32 may be referred to as a row scanning circuit.

Each of the gates of the selection transistor, the transfer transistor, and the reset transistor of each pixel cell is connected to the vertical scanning circuit 32 via a gate input signal line, and the SEL signal, the RSCELL signal, and the TRANS signal which are outputted from the vertical scanning circuit 32 are inputted through the gate input signal line to the respective gates of the selection transistor, the transfer transistor, and the reset transistor. The selection transistor of each pixel cell is caused to be on or off in accordance with Hi potential or Low potential of the SEL signal (selection control signal). The reset transistor is caused to be on or off in accordance with Hi potential or Low potential of the RSCELL signal (reset control signal). The transfer transistor is caused to be on or off in accordance with Hi potential or Low potential of the TRANS signal (transfer control signal).

The charge pump step-up circuit 33 is a charge pump type step-up circuit that increases an input potential to a predetermined potential in accordance with a driving clock signal from the clock generator 37 so as to output the predetermined potential as a step-up voltage. In the present embodiment, the charge pump step-up circuit 33 steps up an input potential to a high potential which is higher than the power source potential. The output signal line of the charge pump step-up circuit 33 is connected to the driver of the vertical scanning circuit 32 which outputs the SEL signal, the RSCELL signal, and the TRANS signal for driving each pixel row so that the charge pump step-up circuit 33 increases the potential of the SEL signal, the RSCELL signal, or the TRANS signal.

The charge pump step-down circuit 34 is a charge pump type step-down circuit that decreases an input potential to a predetermined potential in accordance with a driving clock signal from the clock generator 37 so as to output the predetermined potential as a step-down voltage. In the present embodiment, the charge pump step-down circuit 34 steps down an input potential to a low potential which is lower than the GND potential. The output signal line of the charge pump step-down circuit 34 is connected to the driver of the vertical scanning circuit 32 which outputs the TRANS signal for driving each pixel row so that the charge pump step-down circuit 34 decreases the potential of the TRANS signal.

The clock generator 37 generates driving clock signals for driving the charge pump step-up circuit 33 and the charge pump step-down circuit 34, and inputs the generated driving clock signals to the charge pump step-up circuit 33 and the charge pump step-down circuit 34.

The control logic circuit 38 (control circuit) inputs predetermined signals to the charge pump step-up circuit 33 and the charge pump step-down circuit 34 during each pixel reading time period in order to stop the step-up operation of the charge pump step-up circuit 33 and/or the step-down operation of the charge pump step-down circuit 34.

Figure 4A:
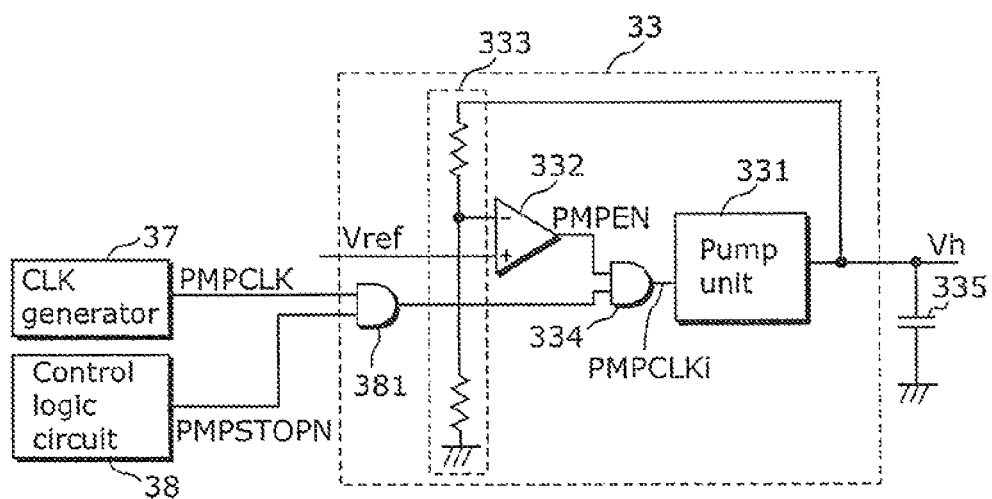
[FIG. 4A]
Figure 4B:
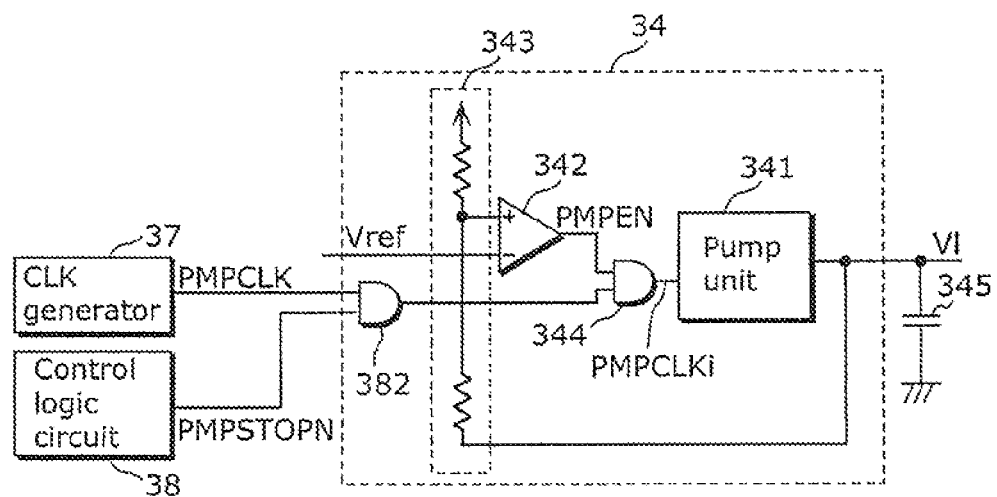
[FIG. 4B]

Next, the charge pump step-up circuit 33, the charge pump step-down circuit 34, the clock generator 37, and the control logic circuit 38 will be described in detail with reference to FIGS. 4A and 4B. FIG. 4A is diagram illustrating the circuit configuration of the charge pump step-up circuit 33 in the solid-state imaging device according to Embodiment 1 of the present invention. FIG. 4B is a diagram illustrating the circuit configuration of the charge pump step-down circuit 34 in the solid-state imaging device according to Embodiment 1 of the present invention.

As illustrated in FIG. 4A, the charge pump step-up circuit 33 according to the present embodiment includes a pump unit 331 for charging or discharging a pump capacitor; a comparator 332 for determining whether or not the potential Vh generated by the pump unit 331 has reached a desired potential with respect to a reference potential (Vref); a resistor potential divider circuit 333 for generating a divided output potential Vh outputted by the charge pump step-up circuit 33 which can be compared by the comparator 332; a first AND logic circuit 381; and a second AND logic circuit 334. A smoothing capacitive element 335 for stabilizing the voltage outputted by the charge pump step-up circuit 33 is connected to the output of the charge pump step-up circuit 33.

The first AND logic circuit 381 outputs a predetermined signal to be inputted to the second AND logic circuit in accordance with the input of a PMPCLK signal which is a driving clock signal supplied from the clock generator 37, and the input of a PMPSTOPN signal which is a driving clock stop control signal supplied from the control logic circuit 38. The second AND logic circuit 334 outputs a PMPCLKi signal for causing the pump unit 331 to be operative or stopped in accordance with the input of an output signal of the first AND logic circuit 381, and the input of a PMPEN signal which is an output signal of the comparator 332.

The charge pump step-up circuit 33 configured in this manner generates a PMPCLKi signal based on the PMPCLK signal generated by the clock generator 37 and the PMPSTOPN signal generated by the control logic circuit 38, and the PMPCLKi signal causes the pump unit 331 to be operative or stopped. When the pump unit 331 is caused to be operative, the charge pump step-up circuit 33 outputs a stepped-up output potential Vh. The electric charge generated by the charge pump step-up circuit 33 is distributed by the smoothing capacitive element 335 so as to stabilize the output potential Vh.

Next, the charge pump step-down circuit 34 according to the present embodiment will be described.

As illustrated in FIG. 4B, the charge pump step-down circuit 34 according to the present embodiment includes a pump unit 341 for charging or discharging a pump capacitor; a comparator 342 for determining whether or not the potential Vl generated by the pump unit 341 has reached a desired potential with respect to a reference potential (Vref); a resistor potential divider circuit 343 for generating a divided output potential Vl outputted by the charge pump step-down circuit 34 which can be compared by the comparator 342; a first AND logic circuit 382; and a second AND logic circuit 344. A smoothing capacitive element 345 for stabilizing the voltage outputted by the charge pump step-down circuit 34 is connected to the output of the charge pump step-down circuit 34.

The first AND logic circuit 382 outputs a predetermined signal to be inputted to the second AND logic circuit in accordance with the input of a PMPCLK signal which is a driving clock signal supplied from the clock generator 37, and the input of a PMPSTOPN signal which is a driving clock stop control signal supplied from the control logic circuit 38. The second AND logic circuit 344 outputs a PMPCLKi signal for causing the pump unit 341 to be operative or stopped in accordance with the input of an output signal of the first AND logic circuit 382, and the input of a PMPEN signal which is an output signal of the comparator 342.

The charge pump step-down circuit 34 configured in this manner generates a PMPCLKi signal based on the PMPCLK signal generated by the clock generator 37 and the PMPSTOPN signal generated by the control logic circuit 38, and the PMPCLKi signal causes the pump unit 341 to be operative or stopped. When the pump unit 341 is caused to be operative, the charge pump step-down circuit 34 outputs a stepped-down output potential Vl. The electric charge generated by the charge pump step-down circuit 34 is distributed by the smoothing capacitive element 345 so as to stabilize the output potential Vl.

The control logic circuit 38 generates a PMPSTOPN signal for stopping the PMPCLK signal of the clock generator 37, and supplies the PMPSTOPN signal to the charge pump step-up circuit 33 or the charge pump step-down circuit 34 during each pixel reading time period. The PMPSTOPN signal at Low causes the input of the PMPCLK signal to be stopped, and the PMPSTOPN signal at Hi causes the input of the PMPCLK signal to resume. That is to say, when the PMPSTOPN signal is Low, the driving clock signals supplied to the pump units 331, 341 are stopped, and the operation of the charge pump step-up circuit 33 and the charge pump step-down circuit 34 are stopped during the time period when the driving clock signals to be inputted to the pump units 331, 341 are stopped.

Figure 5:
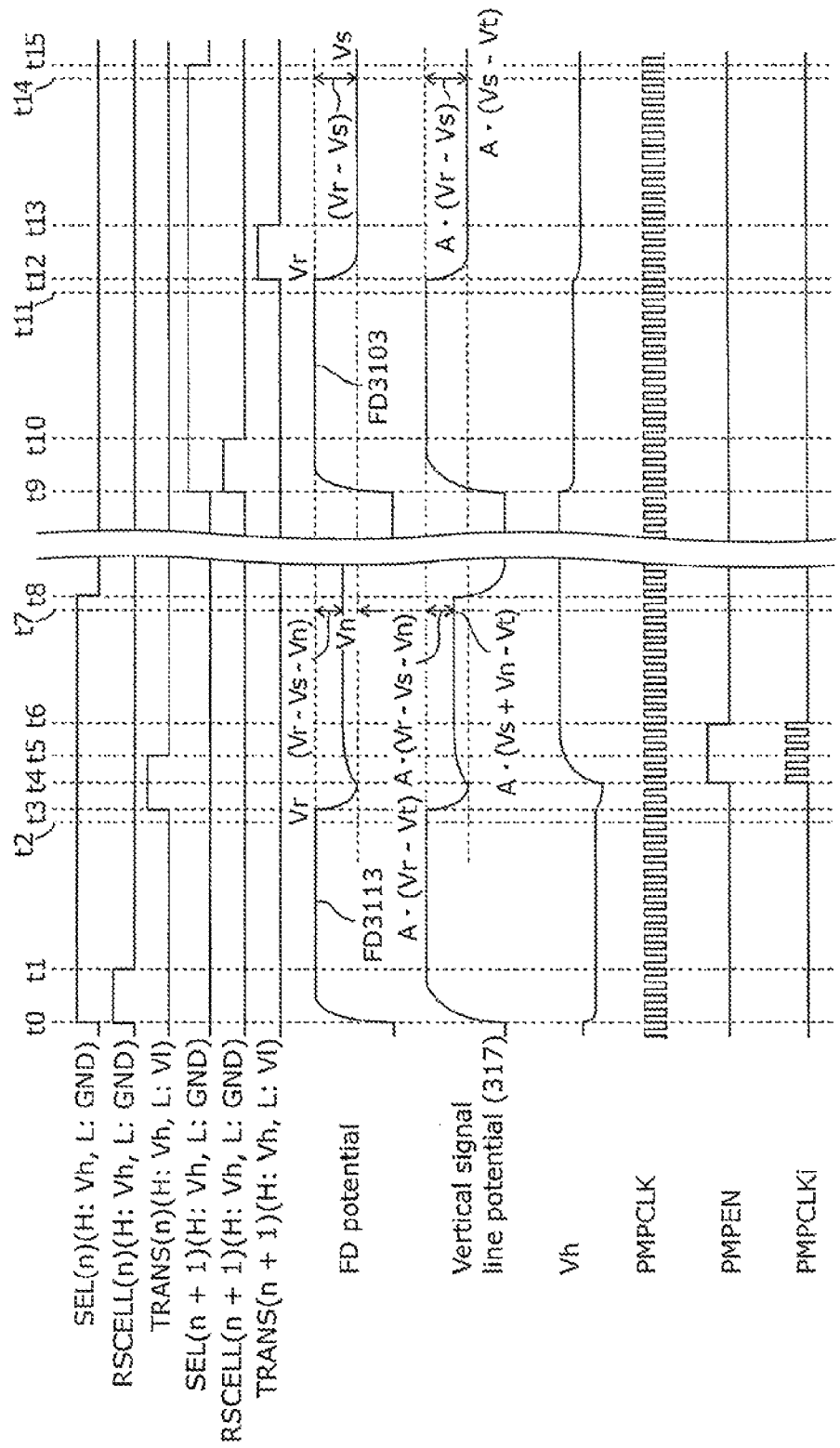
[FIG. 5]
Figure 6:
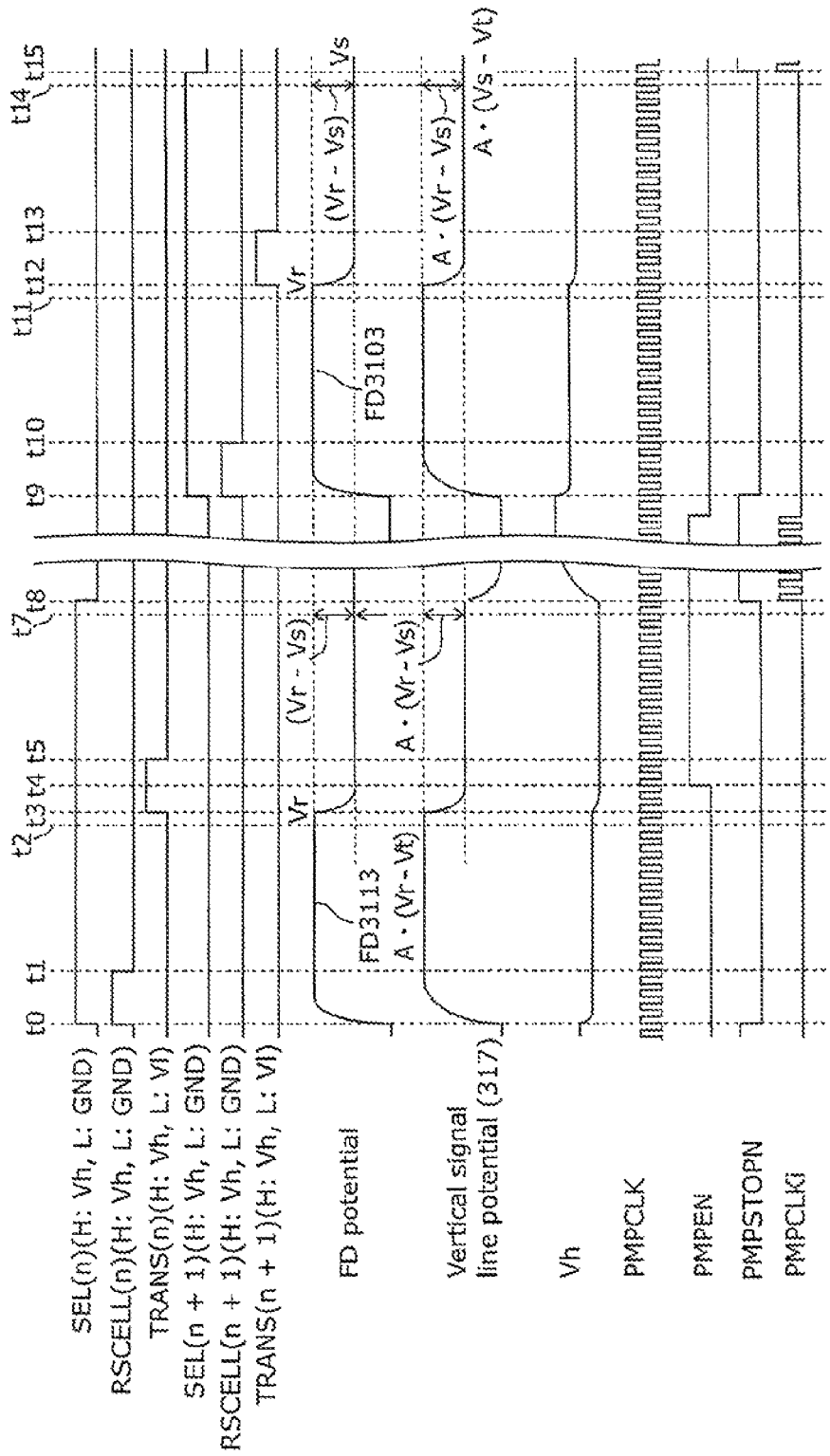
[FIG. 6]
Figure 7:
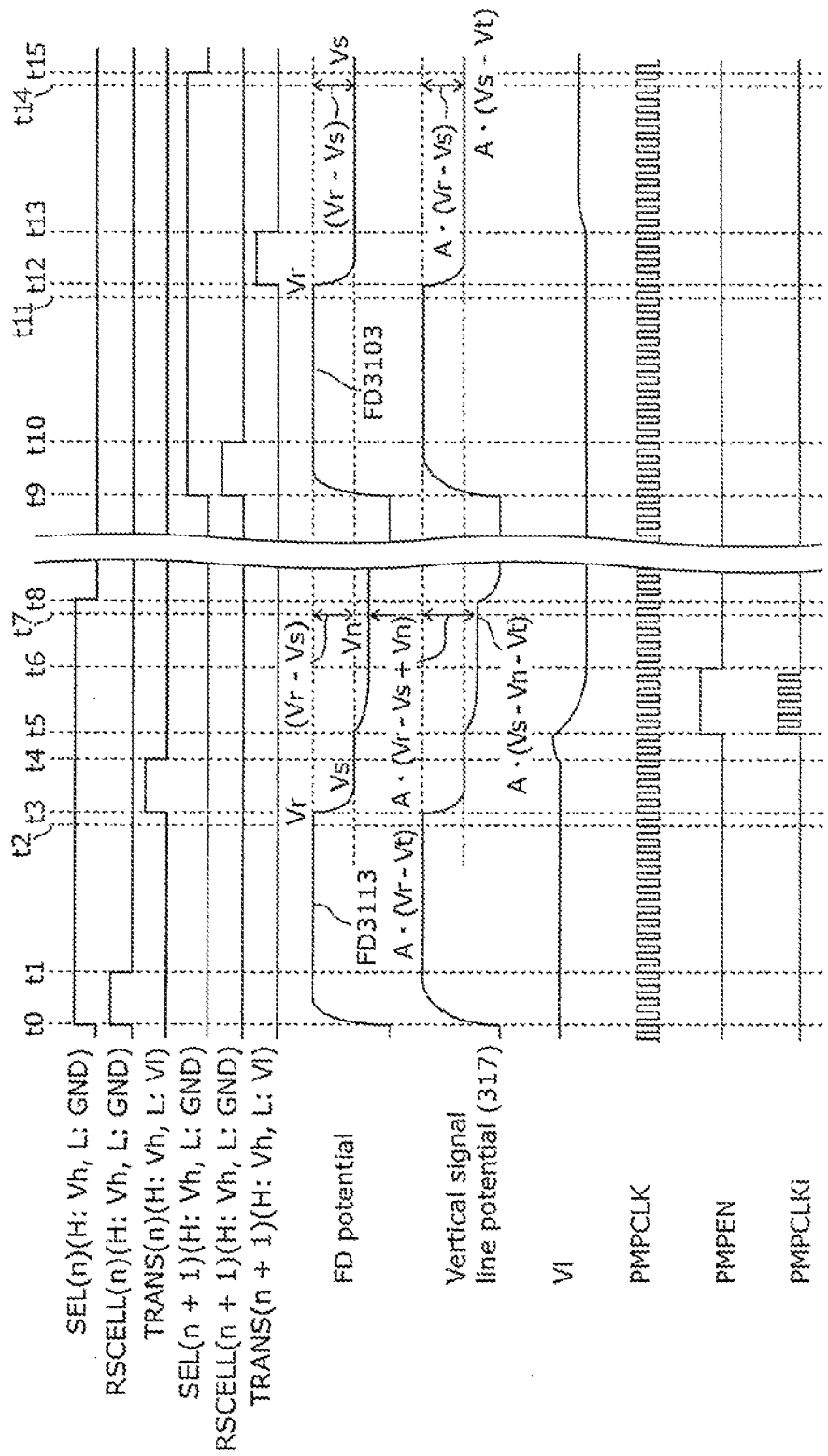
[FIG. 7]
Figure 8:
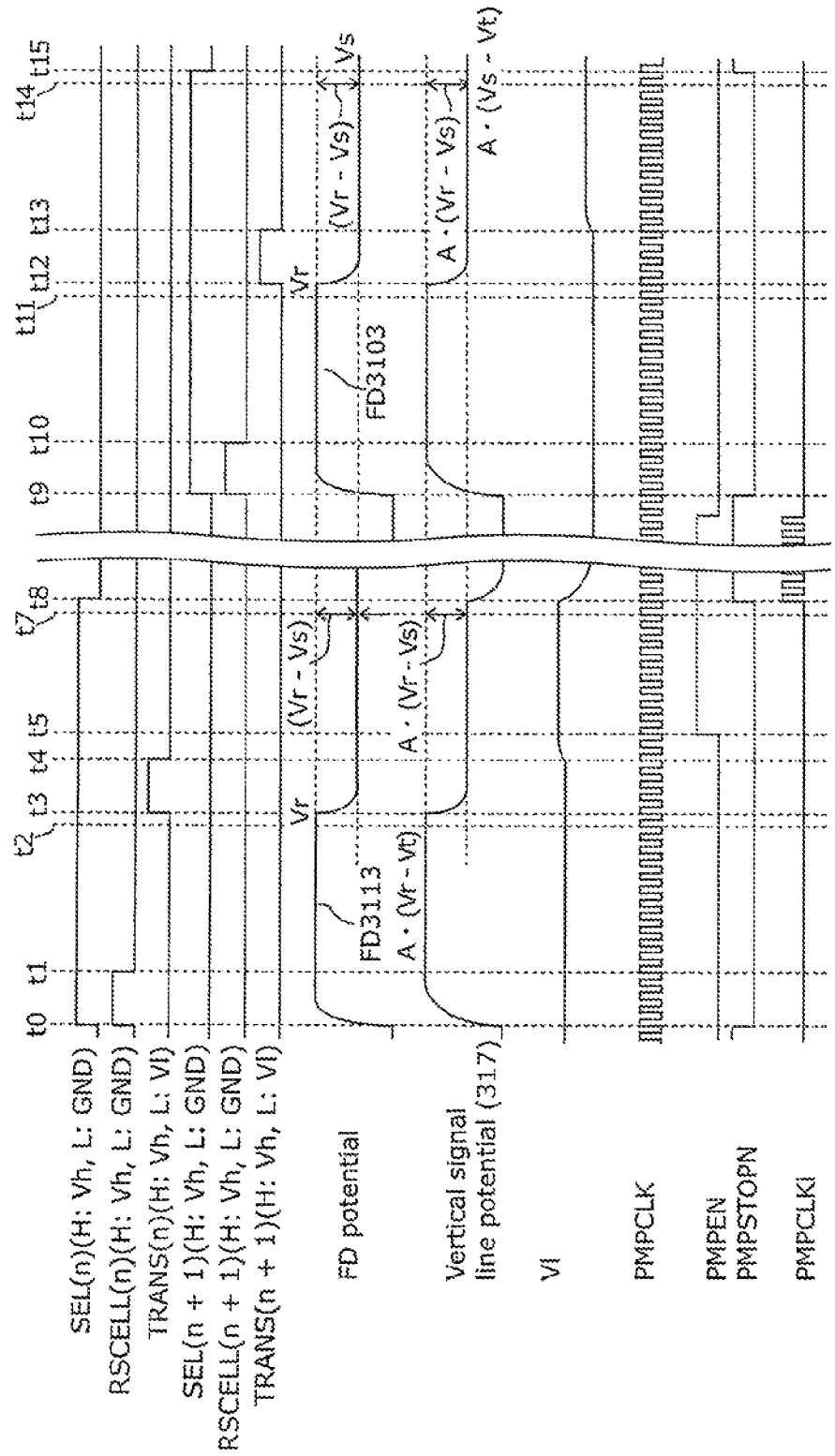
[FIG. 8]
Figure 15A:
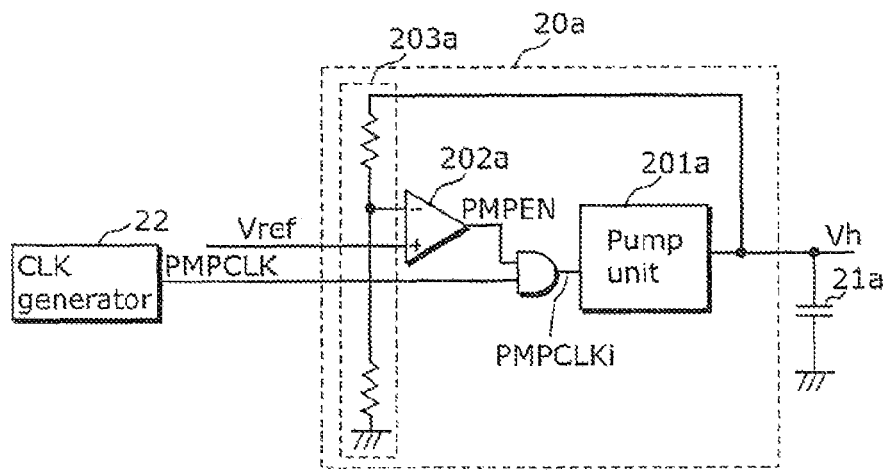
[FIG. 15A]
Figure 15B:
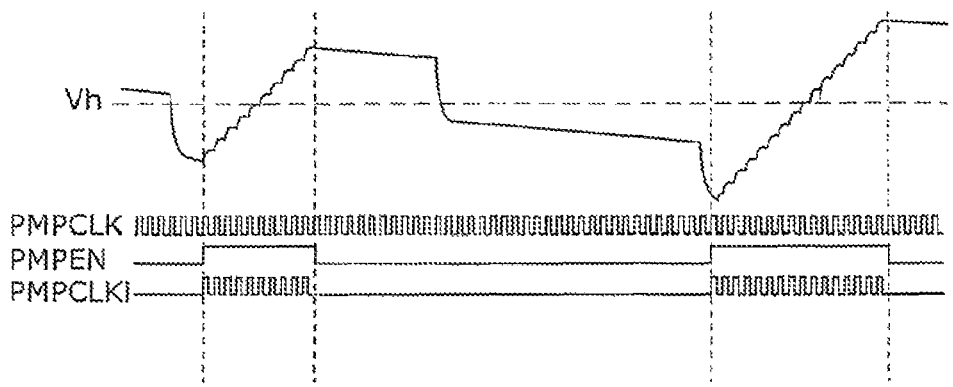
[FIG. 15B]
Figure 16:
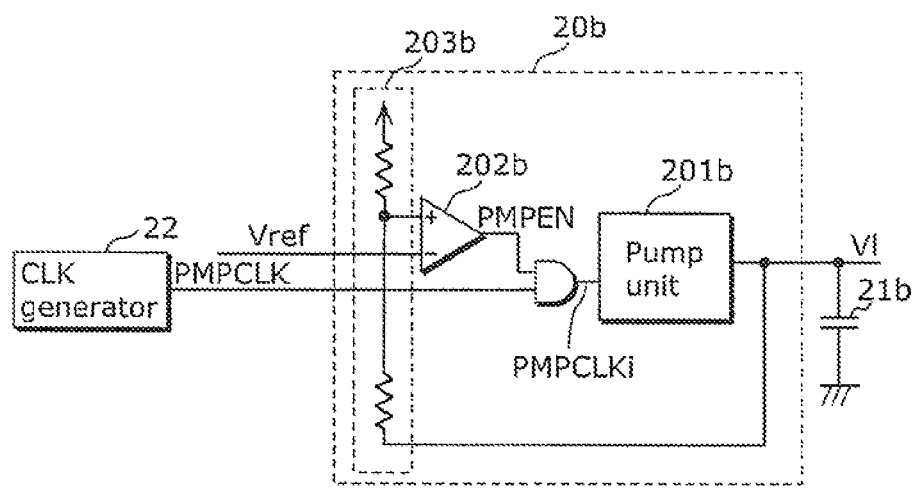
[FIG. 16]
Figure 17:
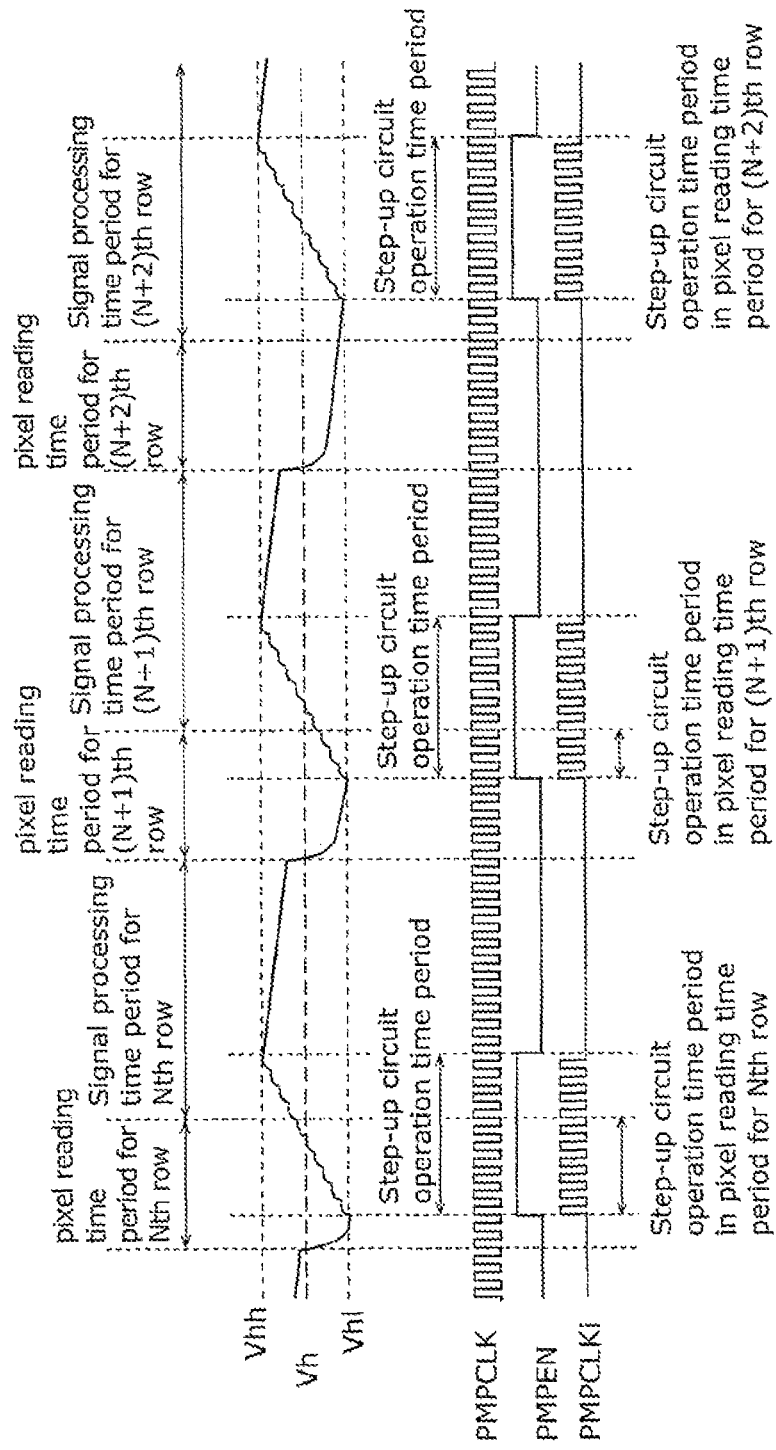
[FIG. 17]

Next, the principle of occurrence of the random horizontal line noise in a conventional solid-state imaging device, and the principle of suppression of the random horizontal line noise in the solid-state imaging device according to Embodiment 1 of the present invention will be described by taking respective operations of the solid-state imaging devices as an example with reference to FIGS. 5 to 8. The operation of the charge pump step-up circuit and the operation of the charge pump step-down circuit are separately described. FIG. 5 is a timing chart for reading pixel signals of the n-th row and the (n+1)th row in a conventional solid-state imaging device using a charge pump step-up circuit. FIG. 6 is a timing chart for reading pixels of the n-th row and the (n+1)th row in the solid-state imaging device according to Embodiment 1 of the present invention, in which a charge pump step-up circuit is used. FIG. 7 is a timing chart for reading pixel signals of the n-th row and the (n+1)th row in a conventional solid-state imaging device using a charge pump step-down circuit. FIG. 8 is a timing chart for reading pixels of the n-th row and the (n+1)th row in the solid-state imaging device according to Embodiment 1 of the present invention, in which a charge pump step-down circuit is used. The circuit configuration of the conventional solid-state imaging device is such that the control logic circuit 38 and the first AND logic circuit 381, 382 are not included in the solid-state imaging device according to Embodiment 1 of the present invention illustrated in FIGS. 4A and 4B, and thus is similar to the configuration in FIGS. 15A and 16. Because the conventional solid-state imaging device basically has the same configuration as Embodiment 1 of the present invention, hereinafter, the reference symbols used in the solid-state imaging device according to Embodiment 1 of the present invention are used for the description of the conventional solid-state imaging device. Similarly, the reference symbols are used in Embodiments 2 and 3.

First, the operation of the conventional solid-state imaging device using a charge pump step-up circuit will be described with reference to FIG. 5. In FIG. 5, SEL(n), RSCELL(n), and TRANS(n) each indicate a control signal supplied to the pixel cells in the n-th row, and SEL(n+1), RSCELL(n+1), and TRANS (n+1) each indicate a control signal supplied to the pixel cells in the (n+1)th row. In FIG. 5, FD potential indicates fluctuations in the potential of the charge detection unit FD3113 of the pixel cell 311, and the charge detection unit FD3103 of the pixel cell 310 in the case where the same amount of light is incident to the pixels in the n-th row and the pixels in the (n+1)th row.

In FIG. 5, the vertical signal line potential indicates the potential of the vertical signal line 317 to which the pixel cell 311 and the pixel cell 310 are connected. Vh indicates an output potential of the charge pump step-up circuit, i.e., Hi potential of the SEL signal, the RSCELL signal, and the TRANS signal. PMPCLK indicates a driving clock signal generated by the clock generator 37. PMPEN indicates an output of the comparator 332 of the charge pump step-up circuit 33. PMPCLKi is a driving clock signal outputted to the pump unit 331 when PMPEN is Hi, and while PMPCLKi is inputted to the pump unit 331, the charge pump step-up circuit operates.

In order to describe the principle of occurrence of the random horizontal line noise caused by the charge pump step-up circuit 33 herein, a case is assumed where the step-up voltage Vh falls below a determination voltage at time t4 in the pixel reading time period for the n-th row, and the charge pump step-up circuit 33 performs a step-up operation in the time period until time t6.

Hereinafter, the operation of the conventional solid-state imaging device using the charge pump step-up circuit 33 is described with reference to FIG. 5.

As illustrated in FIG. 5, in the present embodiment, the time period from t0 to t8 when SEL(n) is Hi is the pixel reading time period for the n-th row, and the time period from t9 to t15 when SEL(n+1) is Hi is the pixel reading time period for the (n+1)th row. At time t2, t11, the signal processing circuit 36 in the subsequent stage receives the first potential (pixel reset potential) for performing CDS processing, and at time t7, t14, the signal processing circuit 36 in the subsequent stage receives the second potential (pixel signal potential) for performing CDS processing. Thus, the differences between the potential of the vertical signal line 317 at time t2, t11 and the potential of the vertical signal line 317 at time t7, t14 indicate the signal outputs according to the amount of input light, respectively.

First, reading of the pixels in the n-th row will be described.

At time t0, SEL(n) becomes Hi and the pixels in the n-th row are selected. At time t0, RSCELL(n) becomes Hi, and the potential of the charge detection unit FD3113 of the pixel cell 311 in the n-th row is reset to the reset potential Vr.

At time t1, RSCELL(n) becomes Low, and the charge detection unit FD3113 maintains the reset potential Vr. As described above, the amplification transistor 3114 and the current load circuit 35 together constitute a source follower amplifier, and thus the potential of the vertical signal line 317 is simply expressed by $A \cdot (Vr-Vt)$ where the threshold voltage of the amplification transistor 3114 is Vt, and the gain of the source follower amplifier is A.

At time t2, the above-mentioned potential $A \cdot (Vr-Vt)$ of the vertical signal line 317 at time t2 is received by the signal processing circuit 36 in the subsequent stage.

Next, at time t3, TRANS(n) becomes Hi, the transfer transistor 3112 is turned on, and the electric charge accumulated in the photodiode 3111 is transferred to the charge detection unit FD3113. At this stage, the potential of the charge detection unit FD3113 is to be set to the potential Vs according to the transfer electric charge in a conventional manner, however the charge pump step-up circuit 33 performs a step-up operation, and the output potential Vh is increased in the time period from time t4 to time t6. For this reason, Hi potential of SEL(n) is also increased, and the charge detection unit FD3113 is increased to a potential higher than the original potential Vs due to coupling with the signal line SEL(n).

Assuming that the increased amount is Vn, the potential of the charge detection unit FD3113 is (Vs+Vn) at time t7 when the signal processing circuit 36 in the subsequent stage receives the second potential (pixel signal potential) for performing CDS processing, and the potential of the vertical signal line 317 at time t7 is $A \cdot (Vs+Vn-Vt)$. Consequently, the signal output of the pixels in the n-th row is the difference between the potential of the vertical signal line 317 at time t2 and the potential of the vertical signal line 317 at time t7, and thus is $A \cdot (Vr-Vs-Vn)$.

Next, reading of the pixels in the (n+1) row will be described.

At time t9, SEL(n+1) becomes Hi, and the pixels in the (n+1)th row are selected. At time t9, RSCELL(n+1) becomes Hi, and the potential of the charge detection unit FD3103 of the pixel cell 310 in the (n+1)th row is reset to the reset potential Vr.

At time t10, RSCELL(n+1) becomes Low, and the charge detection unit FD3103 maintains the reset potential Vr. As described above, the amplification transistor 3104 and the current load circuit 35 together constitute a source follower amplifier, the potential of the vertical signal line 317 is simply expressed by A·(Vr−Vt) similarly to the above where the threshold voltage of the amplification transistor 3104 is Vt, and the gain of the source follower amplifier is A.

At time t11, the above-mentioned potential A·(Vr−Vt) of the vertical signal line 317 at time t11 is received by the signal processing circuit 36 in the subsequent stage.

Next, at time t12, TRANS(n+1) becomes Hi, the transfer transistor 3102 is turned on, and the electric charge accumulated in the photodiode 3101 is transferred to the charge detection unit FD3103. Because the charge pump step-up circuit 33 is not in operation in the reading time period for the (n+1)th row, the potential of the charge detection unit FD3103 becomes the potential Vs according to the transfer electric charge. Therefore, the potential of the charge detection unit FD3103 is Vs at time t14 when the signal processing circuit 36 in the subsequent stage receives the second potential (pixel signal potential) for performing CDS processing, and the potential of the vertical signal line 317 at time t14 is A·(Vs−Vt). Consequently, the signal output of the pixels in the (n+1)th row is the difference between the potential of the vertical signal line 317 at time t11 and the potential of the vertical signal line 317 at time t14, and thus is A·(Vr−Vs).

As described above, in the conventional solid-state imaging device using a charge pump step-up circuit, the noise component of A·Vn is uniformly added to the signal output of the pixels in the n-th row, and thus horizontal line noise occurs. The noise component Vn added to the charge detection unit FD varies for each row to be read, and thus appears in an image as random horizontal line noise. It should be noted that the above-described example of the (n+1)th row is the case of Vn=0.

As illustrated in FIG. 5, the output potential Vh of the charge pump step-up circuit 33 decreases at the rise time of each of the SEL signal, the RSCELL signal, and the TRANS signal because the electric charge accumulated in the smoothing capacitive element is consumed. However, the RSCELL signal and the TRANS signal both become Low at time t2, t11 when the first potential is received for performing CDS processing, and at time t7, t14 when the second potential is received for performing CDS processing, and thus the potentials of the charge detection unit FD3103, 3113 are not affected.

Next, the operation of the solid-state imaging device according to Embodiment 1 of the present invention, in which the charge pump step-up circuit 33 is used will be described with reference to FIG. 6. In FIG. 6, SEL(n), RSCELL(n), and TRANS(n) each indicate a control signal supplied to the pixel cells in the n-th row, and SEL(n+1), RSCELL(n+1), and TRANS (n+1) each indicate a control signal supplied to the pixel cells in the (n+1)th row. In FIG. 6, FD potential indicates fluctuations in the potential of the charge detection unit FD3113 of the pixel cell 311, and the charge detection unit FD3103 of the pixel cell 310 in the case where the same amount of light is incident to the pixels in the n-th row and the pixels in the (n+1)th row.

In FIG. 6, the vertical signal line potential indicates the potential of the vertical signal line 317 to which the pixel cell 311 and the pixel cell 310 are connected. Vh indicates an output potential of the charge pump step-up circuit 33, i.e., Hi potential of the SEL signal, the RSCELL signal, and the TRANS signal. PMPCLK indicates a driving clock signal generated by the clock generator 37. PMPEN indicates an output of the comparator 332 of the charge pump step-up circuit 33. PMPSTOPN is an enable signal of the charge pump step-up circuit 33, and is a driving clock stop control signal for stopping the PMPCLK supplied from the clock generator 37 during the reading time period of each pixel row. When PMPSTOPN is Low, PMPCLK is caused to be stopped, and when PMPSTOPN is Hi, PMPCLK is caused to resume. In the present embodiment, a period in which a pixel cell is selected is the reading time period, and thus when the SEL signal is Hi, PMPSTOPN is Low, and when the SEL signal is Low, PMPSTOPN is Hi. That is to say, PMPSTOPN is an inverted signal of the SEL signal supplied to the vertical scanning circuit 32. PMPCLKi is a driving clock signal outputted to the pump unit 331 when PMPEN is Hi and PMPSTOPN is Hi, the charge pump step-up circuit 33 performs a step-up operation while PMPCLKi is inputted to the pump unit 331.

In order to describe the principle of suppression of the random horizontal line noise caused by the charge pump step-up circuit 33 herein, similarly to the above-described conventional solid-state imaging device, a case is assumed where the step-up voltage Vh falls below a determination voltage at time t4 in the pixel reading time period for the n-th row, and the PMPEN signal outputted by the comparator 332 of the charge pump step-up circuit 33 becomes Hi.

Hereinafter, the operation of the solid-state imaging device according to Embodiment 1 of the present invention, in which the charge pump step-up circuit 33 is used will be described with reference to FIG. 6.

As illustrated in FIG. 6, in the present embodiment, the time period from t0 to t8 when SEL(n) is Hi is the pixel reading time period for the n-th row, and the time period from t9 to t15 when SEL(n+1) is Hi is the pixel reading time period for the (n+1)th row. At time t2, t11, the signal processing circuit 36 in the subsequent stage receives the first potential (pixel reset potential) for performing CDS processing, and at time t7, t14, the signal processing circuit 36 in the subsequent stage receives the second potential (pixel signal potential) for performing CDS processing. Thus, the differences between the potential of the vertical signal line 317 at time t2, t11 and the potential of the vertical signal line 317 at time t7, t14 indicate the signal outputs according to the amount of input light, respectively.

First, reading of the pixels in the n-th row will be described.

At time t0, SEL(n) becomes Hi and, and the pixels in the n-th row are selected. At time t0, RSCELL(n) becomes Hi, and the potential of the charge detection unit FD3113 of the pixel cell 311 in the n-th row is reset to the reset potential Vr.

At time t1, RSCELL(n) becomes Low, and the charge detection unit FD3113 maintains the reset potential Vr. As described above, the amplification transistor 3114 and the current load circuit 35 together constitute a source follower amplifier, the potential of the vertical signal line 317 is simply expressed by A·(Vr−Vt) where the threshold voltage of the amplification transistor 3114 is Vt, and the gain of the source follower amplifier is A.

At time t2, the above-mentioned potential A·(Vr−Vt) of the vertical signal line 317 at time t2 is received by the signal processing circuit 36 in the subsequent stage.

Next, at time t3, TRANS(n) becomes Hi, the transfer transistor 3112 is turned on, and the electric charge accumulated in the photodiode 3111 is transferred to the charge detection unit FD3113, thus the potential of the charge detection unit FD3113 becomes the potential Vs according to the transfer electric charge.

Although the PMPEN signal becomes Hi at time t4, the driving clock signal PMPCLKi supplied to the pump unit 331 of the charge pump step-up circuit 33 is fixed to Low because PMPSTOPN signal is Low, and thus the pump unit 331 does not perform a step-up operation. Consequently, the noise component Vn according to Vh fluctuation is not added to the charge detector FD3113 like the conventional solid-state imaging device described with reference to FIG. 5.

Therefore, the potential of the charge detection unit FD3113 is Vs at time t7 when the signal processing circuit 36 in the subsequent stage receives the second potential for performing CDS processing, and the potential of the vertical signal line 317 at time t7 is A·(Vs−Vt). Consequently, the signal output of the pixels in the n-th row is the difference between the potential of the vertical signal line 317 at time t2 and the potential of the vertical signal line 317 at time t7, and thus is A·(Vr−Vs).

At time t8, the PMPSTOPN signal becomes Hi, and the PMPCLK signal is transmitted to the driving clock signal PMPCLKi which is supplied to the pump unit 331 of the charge pump step-up circuit 33. Accordingly, the charge pump step-up circuit 33 starts a step-up operation, and when generated potential reaches a desired voltage, the charge pump step-up circuit 33 stops the step-up operation.

Next, reading of the pixels in the (n+1)th row will be described.

At time t9, SEL(n+1) becomes Hi, and the pixels in the (n+1)th row are selected. At time t9, RSCELL(n+1) becomes Hi, and the potential of the charge detection unit FD3103 of the pixel cell 310 in the (n+1)th row is reset to the reset potential Vr.

At time t10, RSCELL(n+1) becomes Low, and the charge detection unit FD3103 maintains the reset potential Vr. The amplification transistor 3104 and the current load circuit 35 together constitute a source follower amplifier, the potential of the vertical signal line 317 is simply expressed by A·(Vr−Vt) where the threshold voltage of the amplification transistor 3104 is Vt, and the gain of the source follower amplifier is A.

At time t11, the above-mentioned potential A·(Vr−Vt) of the vertical signal line 317 at time t11 is received by the signal processing circuit 36 in the subsequent stage.

Next, at time t12, TRANS(n+1) becomes Hi, the transfer transistor 3102 is turned on, and the electric charge accumulated in the photodiode 3101 is transferred to the charge detection unit FD3103, thus the potential of the charge detection unit FD3103 becomes the potential Vs according to the transfer electric charge. In this manner, PMPSTOPN is fixed to Low during the reading time period for the (n+1)th row, and thus a driving clock signal is not inputted to the pump unit 331 during the time period, and consequently the pump unit 331 does not perform a step-up operation. Therefore, the potential of the charge detection unit FD3103 is Vs at time t14 when the signal processing circuit 36 in the subsequent stage receives the second potential for performing CDS processing, and the potential of the vertical signal line 317 at time t14 is A·(Vs−Vt). Consequently, the signal output of the pixels in the (n+1)th row is the difference between the potential of the vertical signal line 317 at time t11 and the potential of the vertical signal line 317 at time t14, and thus is A·(Vr−Vs).

As described above, the solid-state imaging device according to Embodiment 1 of the present invention using charge pump step-up circuit 33 causes a step-up operation of the charge pump step-up circuit to be stopped during each pixel reading time period by the PMPSTOPN signal generated by the control logic circuit 38, the step-up operation causing a step-up of Hi potential of the gate input signal line of the transistors which constitutes a pixel cell. Accordingly, the fluctuation in the above-mentioned Hi potential of the gate input signal line in the pixel reading time period can be prevented from being varied for each row of pixels to be read. Therefore, an offset voltage applied to the charge detection unit FD by the parasitic capacitance between the signal lines for driving the transistors in a pixel cell and the charge detection unit FD can be prevented from being varied for each row to be read. In this manner, unlike the conventional solid-state imaging device, the solid-state imaging device according to Embodiment 1 of the present invention prevents the noise component of A·Vn from being added to the signal output of the pixels in the nth row during each pixel reading time period, and thus random horizontal line noise caused by a fluctuation in the output potential of the charge pump step-up circuit can be suppressed, and thus a high quality image can be obtained.

Next, the operation of the conventional solid-state imaging device using the charge pump step-down circuit 34 will be described with reference to FIG. 7. In FIG. 7, SEL(n), RSCELL(n), and TRANS(n) each indicate a control signal supplied to the pixel cells in the n-th row, and SEL(n+1), RSCELL(n+1), and TRANS (n+1) each indicate a control signal supplied to the pixel cells in the (n+1)th row. In FIG. 7, FD potential indicates fluctuations in the potential of the charge detection unit FD3113 of the pixel cell 311, and the charge detection unit FD3103 of the pixel cell 310 in the case where the same amount of light is incident to the pixels in the n-th row and the pixels in the (n+1)th row.

In FIG. 7, the vertical signal line potential indicates the potential of the vertical signal line 317 to which the pixel cell 311 and the pixel cell 310 are connected. Vl indicates the output potential of the charge pump step-down circuit, i.e., the Low potential of the TRANS signal. PMPCLK indicates a driving clock signal generated by the clock generator 37. PMPEN indicates the output of the comparator 342 of the charge pump step-down circuit 34. PMPCLKi is a driving clock signal outputted to the pump unit 341 when PMPEN is Hi, and while PMPCLKi is inputted to the pump unit 341, the charge pump step-down circuit 34 performs a step-down operation.

In order to describe the principle of occurrence of the random horizontal line noise caused by the charge pump step-down circuit 34 herein, a case is assumed where the step-down voltage Vl exceeds a determination voltage at time t5 in the pixel reading time period for the n-th row, and the charge pump step-down circuit 34 performs a step-down operation in the time period until time t6.

Hereinafter, the operation of the conventional solid-state imaging device using the charge pump step-down circuit 34 will be described with reference to FIG. 7.

As illustrated in FIG. 7, in the present embodiment, the time period from t0 to t8 when SEL(n) is Hi is the pixel reading time period for the n-th row, and the time period from t9 to t15 when SEL(n+1) is Hi is the pixel reading time period for the (n+1)th row. At time t2, t11, the signal processing circuit 36 in the subsequent stage receives the first potential (pixel reset potential) for performing CDS processing, and at time t7, t14, the signal processing circuit 36 in the subsequent stage receives the second potential (pixel signal potential) for performing CDS processing. Thus, the differences between the potential of the vertical signal line 317 at time t2, t11 and the potential of the vertical signal line 317 at time t7, t14 indicate the signal outputs according to the amount of input light, respectively.

First, reading of the pixels in the n-th row will be described.

At time t0, SEL(n) becomes Hi, and the pixels in the n-th row are selected. At time t0, RSCELL(n) becomes Hi, and the potential of the charge detection unit FD3113 of the pixel cell 311 in the n-th row is reset to the reset potential Vr.

At time t1, RSCELL(n) becomes Low, and the charge detection unit FD3113 maintains the reset potential Vr. As described above, the amplification transistor 3114 and the current load circuit 35 together constitute a source follower amplifier, the potential of the vertical signal line 317 is simply expressed by $A \cdot (Vr-Vt)$ where the threshold voltage of the amplification transistor 3114 is Vt, and the gain of the source follower amplifier is A.

At time t2, the above-mentioned potential $A \cdot (Vr-Vt)$ of the vertical signal line 317 at time t2 is received by the signal processing circuit 36 in the subsequent stage.

Next, at time t3, TRANS(n) becomes Hi, the transfer transistor 3112 is turned on, and the electric charge accumulated in the photodiode 3111 is transferred to the charge detection unit FD3113. At this stage, the potential of the charge detection unit FD3113 is to be set to the potential Vs according to the transfer electric charge in a conventional manner, however the charge pump step-down circuit 34 performs a step-down operation, and the output potential Vl is decreased in the time period from time t5 to time t6. For this reason, Low potential of TRANS(n) is also decreased, and the charge detection unit FD3113 is decreased to a potential lower than the original potential Vs due to coupling with the signal line TRANS(n).

Assuming that the decreased amount is Vn, the potential of the charge detection unit FD3113 is (Vs−Vn) at time t7 when the signal processing circuit 36 in the subsequent stage receives the second potential (pixel signal potential) for performing CDS processing, and the potential of the vertical signal line 317 at time t7 is $A \cdot (Vs-Vn-Vt)$. Consequently, the signal output of the pixels in the n-th row is the difference between the potential of the vertical signal line 317 at time t2 and the potential of the vertical signal line 317 at time t7, and thus is $A \cdot (Vr-Vs+Vn)$.

Next, reading of the pixels in the (n+1)th row will be described.

At time t9, SEL(n+1) becomes Hi, and the pixels in the (n+1)th row are selected. At time t9, RSCELL(n+1) becomes Hi, and the potential of the charge detection unit FD3103 of the pixel cell 310 in the (n+1)th row is reset to the reset potential Vr.

At time t10, RSCELL(n+1) becomes Low, and the charge detection unit FD3103 maintains the reset potential Vr. As described above, the amplification transistor 3104 and the current load circuit 35 together constitute a source follower amplifier, the potential of the vertical signal line 317 is simply expressed by $A \cdot (Vr-Vt)$ where the threshold voltage of the amplification transistor 3104 is Vt, and the gain of the source follower amplifier is A.

At time t11, the above-mentioned potential $A \cdot (Vr-Vt)$ of the vertical signal line 317 at time t11 is received by the signal processing circuit 36 in the subsequent stage.

Next, at time t12, TRANS(n+1) becomes Hi, the transfer transistor 3102 is turned on, and the electric charge accumulated in the photodiode 3101 is transferred to the charge detection unit FD3103. Because the charge pump step-down circuit 34 is not in operation in the reading time period for the (n+1)th row, the potential of the charge detection unit FD3103 becomes the potential Vs according to the transfer electric charge. Therefore, the potential of the charge detection unit FD3103 is Vs at time t14 when the signal processing circuit 36 in the subsequent stage receives the second potential (pixel signal potential) for performing CDS processing, and the potential of the vertical signal line 317 at time t14 is $A \cdot (Vs-Vt)$. Consequently, the signal output of the pixels in the (n+1)th row is the difference between the potential of the vertical signal line 317 at time t11 and the potential of the vertical signal line 317 at time t14, and thus is $A \cdot (Vr-Vs)$.

As described above, in the conventional solid-state imaging device using a charge pump step-up circuit, the noise component of $A \cdot Vn$ is uniformly added to the signal output of the pixels in the n-th row, on which a step-down operation is performed by the charge pump step-down circuit 34 during the pixel reading time period, and thus horizontal line noise occurs. The noise component Vn added to the charge detection unit FD varies for each row to be read, and thus appears in an image as random horizontal line noise. It should be noted that the above-described example of the (n+1)th row is the case of Vn=0.

Next, the operation of the solid-state imaging device according to Embodiment 1 of the present invention, in which the charge pump step-down circuit 34 is used will be described with reference to FIG. 8. In FIG. 8, SEL(n), RSCELL(n), and TRANS(n) each indicate a control signal supplied to the cells in the n-th row, and SEL(n+1), RSCELL(n+1), and TRANS (n+1) each indicate a control signal supplied to the cells in the (n+1)th row. In FIG. 8, FD potential indicates fluctuations in the potential of the charge detection unit FD3113 of the pixel cell 311, and the charge detection unit FD3103 of the pixel cell 310 in the case where the same amount of light is incident to the pixels in the n-th row and the pixels in the (n+1)th row.

In FIG. 8, the vertical signal line potential indicates the potential of the vertical signal line 317 to which the pixel cell 311 and the pixel cell 310 are connected. Vl indicates the output potential of the charge pump step-down circuit 34, i.e., the Low potential of the TRANS signal. PMPCLK indicates a driving clock signal generated by the clock generator 37. PMPEN indicates the output of the comparator 342 of the charge pump step-down circuit 34. PMPSTOPN is an enable signal of the charge pump step-down circuit 34, and is a driving clock stop control signal for stopping the PMPCLK supplied from the clock generator 37 during the reading time period of each pixel row. When PMPSTOPN is Low, PMPCLK is caused to be stopped, and when PMPSTOPN is Hi, PMPCLK is caused to resume. In the present embodiment, a period in which a pixel cell is selected is the reading time period, and thus when the SEL signal is Hi, PMPSTOPN is Low, and when the SEL signal is Low, PMPSTOPN is Hi. That is to say, PMPSTOPN is an inverted signal of the SEL signal supplied to the vertical scanning circuit 32. PMPCLKi is a driving clock signal outputted to the pump unit 341 when PMPEN is Hi and PMPSTOPN is Hi, and the charge pump step-down circuit 34 performs a step-down operation while PMPCLKi is inputted to the pump unit 341.

In order to describe the principle of suppression of the random horizontal line noise caused by the charge pump step-down circuit 34 herein, similarly to the above-described conventional solid-state imaging device, a case is assumed where the step-down voltage Vl exceeds a determination voltage at time t5 in the pixel reading time period for the n-th row, and the PMPEN signal outputted by the comparator 342 of the charge pump step-down circuit 34 becomes Hi.

Next, the operation of the solid-state imaging device according to Embodiment 1 of the present invention, in which the charge pump step-down circuit 34 is used will be described with reference to FIG. 8.

As illustrated in FIG. 8, in the present embodiment, the time period from t0 to t8 when SEL(n) is Hi is the pixel reading time period for the n-th row, and the time period from t9 to t15 when SEL(n+1) is Hi is the pixel reading time period for the (n+1)th row. At time t2, t11, the signal processing circuit 36 in the subsequent stage receives the first potential (pixel reset potential) for performing CDS processing, and at time t7, t14, the signal processing circuit 36 in the subsequent stage receives the second potential (pixel signal potential) for performing CDS processing. Thus, the differences between the potential of the vertical signal line 317 at time t2, t11 and the potential of the vertical signal line 317 at time t7, t14 indicate the signal outputs according to the amount of input light, respectively.

First, reading of the pixels in the n-th row will be described.

At time t0, SEL(n) becomes Hi, and the pixels in the n-th row are selected. At time to, RSCELL(n) becomes Hi, and the potential of the charge detection unit FD3113 of the pixel cell 311 in the n-th row is reset to the reset potential Vr.

At time t1, RSCELL(n) becomes Low, and the charge detection unit FD3113 maintains the reset potential Vr. As described above, the amplification transistor 3114 and the current load circuit 35 together constitute a source follower amplifier, the potential of the vertical signal line 317 is simply expressed by $A \cdot (Vr-Vt)$ where the threshold voltage of the amplification transistor 3114 is Vt, and the gain of the source follower amplifier is A.

At time t2, the above-mentioned potential $A \cdot (Vr-Vt)$ of the vertical signal line 317 at time t2 is received by the signal processing circuit 36 in the subsequent stage.

Next, at time t3, TRANS(n) becomes Hi, the transfer transistor 3112 is turned on, and the electric charge accumulated in the photodiode 3111 is transferred to the charge detection unit FD3113, thus the potential of the charge detection unit FD3113 becomes the potential Vs according to the transfer electric charge.

Although the PMPEN signal becomes Hi at time t4, the driving clock signal PMPCLKi supplied to the pump unit 341 of the charge pump step-down circuit 34 is fixed to Low because PMPSTOPN signal is Low, and thus the pump unit 341 does not perform a step-down operation. Consequently, the noise component Vn according to Vl fluctuation is not added to the charge detector FD3113 like the conventional solid-state imaging device described with reference to FIG. 7. Thus, the potential of the charge detection unit FD3113 is Vs at time t7 when the signal processing circuit 36 in the subsequent stage receives the second potential for performing CDS processing, and the potential of the vertical signal line 317 at time t7 is $A \cdot (Vs-Vt)$. Consequently, the signal output of the pixels in the n-th row is the difference between the potential of the vertical signal line 317 at time t2 and the potential of the vertical signal line 317 at time t7, and thus is $A \cdot (Vr-Vs)$.

At time t8 when a pixel signal reading time period expires, the PMPSTOPN signal becomes Hi, and the PMPCLK signal is transmitted to the driving clock signal PMPCLKi which is supplied to the pump unit 341 of the charge pump step-down circuit 34. Accordingly, the charge pump step-down circuit 34 starts a step-down operation, and when generated potential reaches a desired potential, the charge pump step-down circuit 34 stops the step-down operation.

Next, reading of the pixels in the (n+1)th row will be described.

At time t9, SEL(n+1) becomes Hi, and the pixels in the (n+1)th row are selected. At time t9, RSCELL(n+1) becomes Hi, and the potential of the charge detection unit FD3103 of the pixel cell 310 in the (n+1)th row is reset to the reset potential Vr.

At time t10, RSCELL(n+1) becomes Low, and the charge detection unit FD3103 maintains the reset potential Vr. As described above, the amplification transistor 3104 and the current load circuit 35 together constitute a source follower amplifier, the potential of the vertical signal line 317 is simply expressed by $A \cdot (Vr-Vt)$ where the threshold voltage of the amplification transistor 3104 is Vt, and the gain of the source follower amplifier is A.

At time t11, the above-mentioned potential $A \cdot (Vr-Vt)$ of the vertical signal line 317 at time t11 is received by the signal processing circuit 36 in the subsequent stage.

Next, at time t12, TRANS(n+1) becomes Hi, the transfer transistor 3102 is turned on, and the electric charge accumulated in the photodiode 3101 is transferred to the charge detection unit FD3103, and thus the potential of the charge detection unit FD3103 becomes the potential Vs according to the transfer electric charge. In this manner, PMPSTOPN is fixed to Low during the reading time period for the (n+1)th row, and thus a driving clock signal is not inputted to the pump unit 341 during the time period, and consequently the pump unit 341 does not perform a step-down operation. Therefore, the potential of the charge detection unit FD3103 is Vs at time t14 when the signal processing circuit 36 in the subsequent stage receives the second potential for performing CDS processing, and the potential of the vertical signal line 317 at time t14 is $A \cdot (Vs-Vt)$. Consequently, the signal output of the pixels in the (n+1)th row is the difference between the potential of the vertical signal line 317 at time t11 and the potential of the vertical signal line 317 at time t14, and thus is $A \cdot (Vr-Vs)$.

As described above, the solid-state imaging device according to Embodiment 1 of the present invention using charge pump step-down circuit 34 causes a step-down operation of the charge pump step-down circuit 34 to be stopped during each pixel reading time period by the PMPSTOPN signal generated by the control logic circuit 38, the step-down operation causing a step-down of Low potential of the gate input signal line of the transistors which constitutes a pixel cell. Accordingly, the fluctuation in the above-mentioned Low potential of the gate input signal line in the pixel reading time period can be prevented from being varied for each row of pixels to be read. Therefore, an offset voltage applied to the charge detection unit FD by the parasitic capacitance between the signal lines for driving the transistors in a pixel cell and the charge detection unit FD can be prevented from being varied for each row to be read. In this manner, unlike the conventional solid-state imaging device, the solid-state imaging device according to Embodiment 1 of the present invention prevents the noise component of $A \cdot Vn$ from being added to the signal output of the pixels in the nth row during each pixel reading time period, and thus random horizontal line noise caused by a fluctuation in the output potential of the charge pump step-down circuit can be suppressed, and thus a high quality image can be obtained.

As illustrated in FIG. 8, the output potential Vh of the charge pump step-up circuit 33 increases at the rise time of the TRANS signal because the electric charge accumulated in the smoothing capacitive element is consumed. However, the consumed amount of charge is determined by the total of gate capacitances of the transfer transistor 3102 which is a load of the TRANS signal of each line, and has no difference between the rows, thus horizontal line noise is not caused.

As described above, in the solid-state imaging device according to Embodiment 1 of the present invention, random horizontal line noise which is caused by the charge pump step-up circuit 33 or the charge pump step-down circuit 34, and appears in an image can be effectively suppressed by adding an extremely simple AND circuit which receives the inverted signal of the SEL signal generated by the control logic circuit, and the driving clock input of the charge pump step-up circuit 33 or the charge pump step-down circuit 34, the SEL signal controlling the pixel signal reading time period.

The solid-state imaging device according to the present embodiment can be applied to not only a solid-state imaging device in which light is inputted from the side of the semiconductor substrate, on which transistors and wiring are formed, but also to a back-side illuminated solid-state imaging device in which light is inputted from the opposite side of the semiconductor substrate. Because a back-side illuminated solid-state imaging device has a large wiring capacity, the present invention has a significant effect on suppressing the fluctuation of the output of a charge pump step-up circuit and a charge pump step-down circuit.

In the solid-state imaging device according to the present embodiment, a selection transistor is disposed in each pixel. In general, in order to improve the linearity of the pixel output, it is effective to reduce the on-resistance of the selection transistor, and the output of the above-described charge pump step-up circuit can be used as the Hi voltage. In the case where the Hi voltage fluctuates while reading pixel signals, the on-resistance of the selection transistor fluctuates, and accordingly the pixel output fluctuates, thereby generating horizontal line noise. Therefore, the solid-state imaging device according to the present invention is also effective in achieving low noise in the pixel cell configuration with a selection transistor, while ensuring a high linearity of the pixel output.

[Modification of Embodiment 1]

Figure 9:
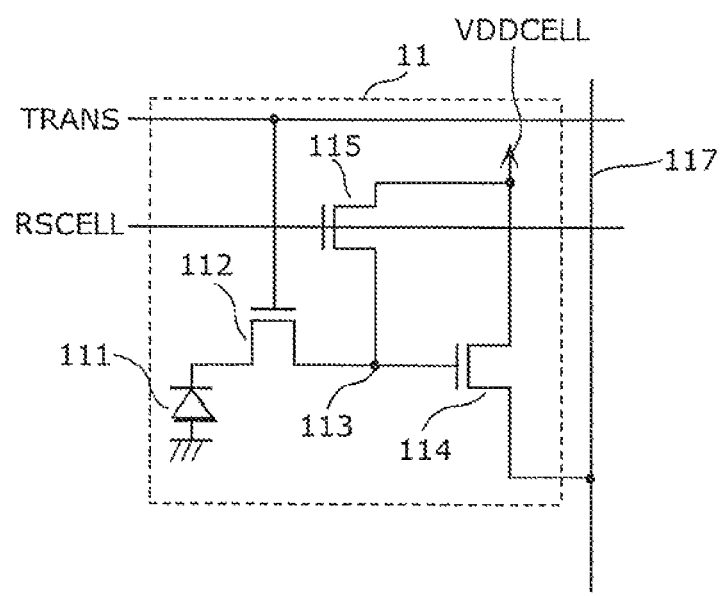
[FIG. 9]

Next, a modification of the above-described solid-state imaging device according to Embodiment 1 of the present invention will be described with reference to FIG. 9. FIG. 9 is a diagram illustrating the pixel configuration of a solid-state imaging device according to a modification of Embodiment 1 of the present invention.

The solid-state imaging device illustrated in FIG. 9, according to the modification of Embodiment 1 of the present invention differs from the solid-state imaging device illustrated in FIG. 1, according to Embodiment 1 of the present invention in that the solid-state imaging device according to the modification does not include the selection transistor 106 which is included in the solid-state imaging device according to Embodiment 1 of the present invention.

That is to say, the solid-state imaging device illustrated in FIG. 9 according to the modification of Embodiment 1 of the present invention has a configuration in which the power source potential supplied to the pixel cells in common is not a constant potential, and specific pixel cells are selectively allowed to output a signal potential by causing the power source potential to change between high potential and low potential transition periodically without providing the selection transistor 106 in the above-described pixel cell 10.

Specifically, as illustrated in FIG. 9, a pixel cell 11 of the solid-state imaging device according to the modification of Embodiment 1 of the present invention includes a photodiode 111 as a photoelectric conversion unit; a charge detection unit FD113 for converting a signal charge accumulated in the photodiode 111 to a signal voltage; a transfer transistor 112 for transferring the signal charge accumulated in the photodiode 111 to the charge detection unit FD113; an amplification transistor 114 for amplifying the potential of the charge detection unit FD113; and a reset transistor 115 for resetting the charge detection unit FD113 to a reset potential. The output of the amplification transistor 114 is directly connected to the vertical signal line 117 in common. In the solid-state imaging device according to the modification of Embodiment 1 of the present invention, the pixel cells configured in this manner are arranged in a matrix form, and the vertical signal line 117 is shared by the pixel cells in each column.

Similarly to the pixel cell 10 of FIG. 1, in order to improve the characteristics of the pixel cell 11, Hi potential of the drive pulse for driving the pixel cell 11 may be set to a potential higher than the power source potential, and Low potential may be set to a potential lower than the GND potential.

It should be noted that a unit pixel cell illustrated in FIG. 9 has what is called one pixel per cell structure in which the photodiode (light receiving unit) 111, the transfer transistor 112, the charge detection unit FD (floating diffusion) 113, the reset transistor 115, and the amplification transistor 114 are each included in the unit pixel cell. However, the structure of the unit pixel cell is not limited to the above structure. For example, what is called multiple pixels per cell structure may be adopted in which the unit pixel cell includes a plurality of light receiving units, and either one or all of the floating diffusion, the reset transistor and the amplification transistor are shared within the unit cell.

A structure may be adopted in which the photodiode (light receiving unit) 111 of FIG. 9 is formed on the surface of the semiconductor substrate, i.e., the surface on which the gates of the transistors and wiring are disposed. Alternatively, the structure of what is called a rear-surface irradiation type image sensor (back-side illuminated solid-state imaging device) may be used, in which the photodiode (light receiving unit) is formed on the surface opposite to the surface on which the gates of the transistors and wiring are disposed.

The operation of the solid-state imaging device according to the modification of Embodiment 1 of the present invention which includes the above pixel cell 11 is similar to the operation of the solid-state imaging device according to Embodiment 1 of the present invention, described with reference to FIGS. 6 and 8

Therefore, the solid-state imaging device according to the modification of Embodiment 1 of the present invention provides effects similar to those of the above-described solid-state imaging device according to Embodiment 1 of the present invention.

Embodiment 2

Next, the solid-state imaging device according to Embodiment 2 of the present invention will be described.

The circuit configuration of the solid-state imaging device according to Embodiment 2 of the present invention is the same as that of the solid-state imaging device according to Embodiment 1 of the present invention, illustrated with reference to FIGS. 1 to 4B. Therefore, description of the configuration of the former solid-state imaging device is omitted, the configuration being the same as that of the solid-state imaging device according to Embodiment 1 of the present invention, illustrated with reference to FIGS. 1 to 4B. In the following, description is provided by using the same reference symbols as in the solid-state imaging device according to Embodiment 1 of the present invention, illustrated with reference to FIGS. 1 to 4B.

Figure 10:
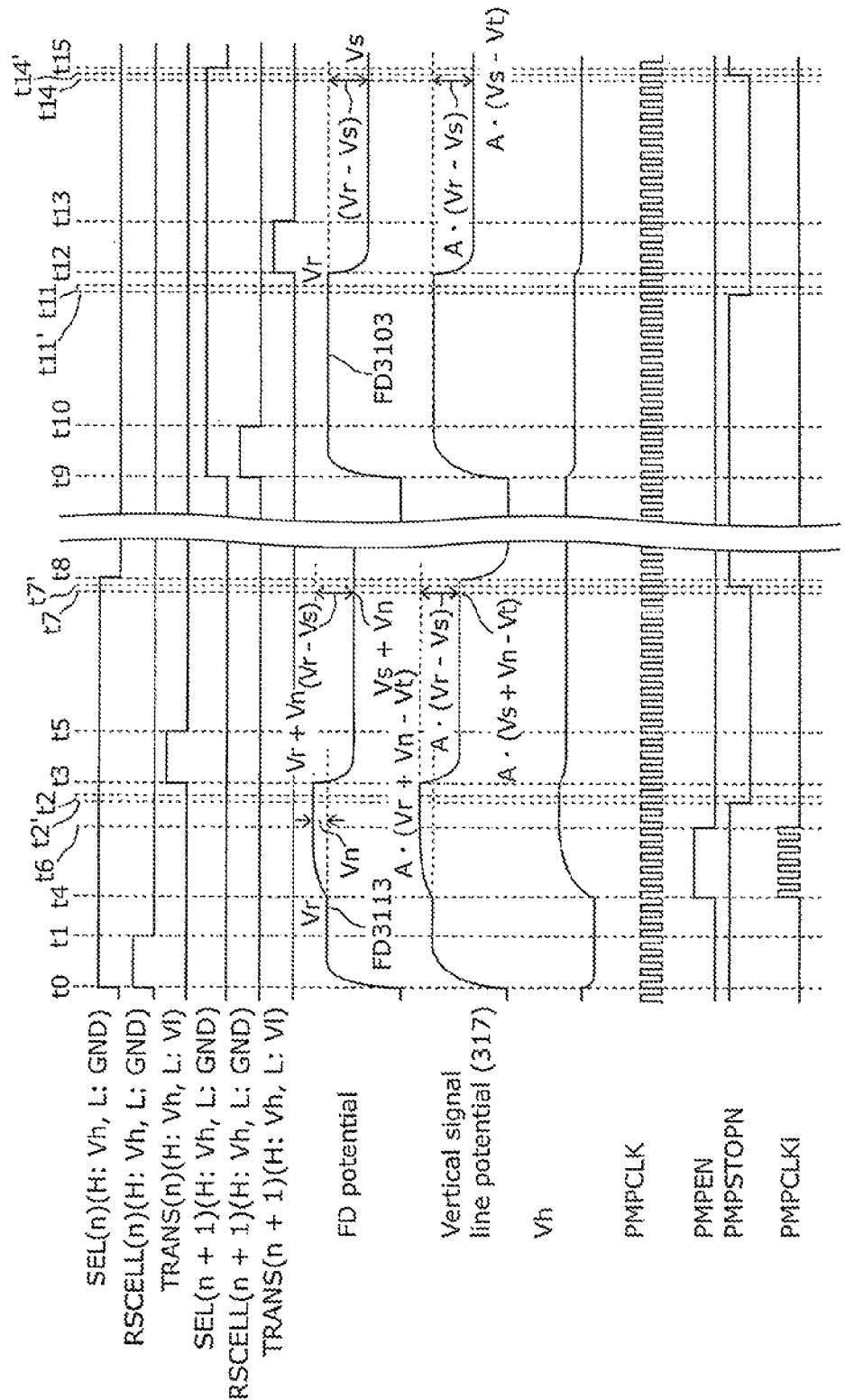
[FIG. 10]

The solid-state imaging device according to Embodiment 2 of the present invention differs from the solid-state imaging device according to Embodiment 1 of the present invention in the timing of the operation of the charge pump step-up circuit. Hereinafter, the operation of the solid-state imaging device according to Embodiment 2 of the present invention, in which a charge pump step-up circuit is used will be described with reference to FIG. 10. FIG. 10 is a timing chart for reading pixel signals of the n-th row and the (n+1)th row in the solid-state imaging device according to Embodiment 2 of the present invention, in which a charge pump step-up circuit is used.

In FIG. 10, SEL(n), RSCELL(n), and TRANS(n) each indicate a control signal supplied to the pixel cells in the n-th row, and SEL(n+1), RSCELL(n+1), and TRANS (n+1) each indicate a control signal supplied to the pixels cells in the (n+1)th row. In FIG. 10, FD potential indicates fluctuations in the potential of the charge detection unit FD3113 of the pixel cell 311, and the charge detection unit FD3103 of the pixel cell 310 in the case where the same amount of light is incident to the pixels in the n-th row and the pixels in the (n+1)th row. The vertical signal line potential indicates the potential of the vertical signal line 317 to which the pixel cell 311 and the pixel cell 310 are connected. Vh indicates an output potential of the charge pump step-up circuit 33, i.e., Hi potential of the SEL signal, the RSCELL signal, and the TRANS signal. PMPCLK indicates a driving clock signal generated by the clock generator 37. PMPEN indicates an output of the comparator 332 of the charge pump step-up circuit 33. PMPSTOPN is an enable signal of the charge pump step-up circuit 33, as and is a driving clock stop control signal for stopping the PMPCLK supplied from the clock generator 37 during the reading time period of each pixel row. When PMPSTOPN is Low, PMPCLK is caused to be stopped, and when PMPSTOPN is Hi, PMPCLK is caused to resume. PMPCLKi is a driving clock signal outputted to the pump unit 331 when PMPEN is Hi and PMPSTOPN is Hi, the charge pump step-up circuit 33 performs a step-up operation while PMPCLKi is inputted to the pump unit 331.

In order to describe the principle of suppression of the random horizontal line noise caused by the charge pump step-up circuit 33 in the present embodiment, a case is assumed where the step-up voltage Vh falls below a determination voltage at time t4 in the pixel reading time period for the n-th row, and the charge pump step-up circuit 33 performs a step-up operation in the time period until time t6.

Hereinafter, the operation of the solid-state imaging device according to Embodiment 2 of the present invention, in which the charge pump step-up circuit 33 is used will be described with reference to FIG. 10.

As illustrated in FIG. 10, in the present embodiment, the time period from t0 to t8 when SEL(n) is Hi is the pixel reading time period for the n-th row, and the time period from t9 to t15 when SEL(n+1) is Hi is the pixel reading time period for the (n+1)th row. At time t2, t11, the signal processing circuit 36 in the subsequent stage receives the first potential (pixel reset potential) for performing CDS processing, and at time t7, t14, the signal processing circuit 36 in the subsequent stage receives the second potential (pixel signal potential) for performing CDS processing. Thus, the differences between the potential of the vertical signal line 317 at time t2, t11 and the potential of the vertical signal line 317 at time t7, t14 indicate the signal outputs according to the amount of input light, respectively. Fall times of PMPSTOPN signal, t2' and t11' are respectively between time t0, t9 and time t2, t11 at which the signal processing circuit 36 in the subsequent stage receives the first potential for performing CDS processing, and rise times of PMPSTOPN signal, t7' and t14' are respectively between time t7, t14 and time t8, t15, where the signal processing circuit 36 in the subsequent stage receives the second potential for performing CDS processing at t7, t14, and a pixel reading time period expires at t8, t15.

First, reading of the pixels in the n-th row will be described.

At time t0, SEL(n) becomes Hi, and the pixels in the n-th row are selected. At time t0, RSCELL(n) becomes Hi, and the potential of the charge detection unit FD3113 of the pixel cell 311 in the n-th row is reset to the reset potential Vr.

At time t1, RSCELL(n) becomes Low, and the charge detection unit FD3113 maintains the reset potential Vr. The amplification transistor 3114 and the current load circuit 35 together constitute a source follower amplifier, the potential of the vertical signal line 317 is simply expressed by A·(Vr−Vt) where the threshold voltage of the amplification transistor 3114 is Vt, and the gain of the source follower amplifier is A.

Next, during the time period between t4 and t6, the charge pump step-up circuit 33 performs a step-up operation, and the potential of the charge detection unit FD 3113 is increased due to coupling by the parasitic capacitance between the SEL(n) signal line and the charge detection unit FD3113. Assuming that the increased amount is Vn, the potential of the vertical signal line 317 at time t2 when the signal processing circuit 36 in the subsequent stage receives the first potential for performing CDS processing is expressed by A·(Vr+Vn−Vt) where the threshold voltage of the amplification transistor 3114 is Vt, and the gain of the source follower amplifier is A.

Next, during the time period between t3 and t5, TRANS(n) is Hi, the transfer transistor 3112 is turned on, and the electric charge accumulated in the photodiode 3111 is transferred to the charge detection unit FD3113. The amount of variation in the potential of the charge detection unit FD3113 at the time of transfer is determined only by the amount of charge accumulated in the photodiode 3111 and the capacitance value of the charge detection unit FD3113, thus this is the same as the case where the noise component Vn is not added to the charge detection unit FD3113.

Thus, the potential of the charge detection unit FD3113 is (Vs+Vn) at time t7 when the signal processing circuit 36 in the subsequent stage receives the second potential for performing CDS processing, and the potential of the vertical signal line 317 at time t7 is A·(Vs+Vn−Vt). Accordingly, the signal output of the pixels in the n-th row is A·(Vr−Vs), and the noise component Vn caused by the step-up operation performed by the charge pump step-up circuit 33 is removed, and no random horizontal line noise occurs.

For the solid-state imaging device according to Embodiment 2 of the present invention, the operation of the charge pump step-up circuit has been described, and the operation of the charge pump step-down circuit illustrated in FIG. 4B is also similarly described. In this case, the noise component Vn caused by the step-down operation performed by the charge pump step-down circuit is removed in a similar manner as described above by generating the PMPSTOPN signal as illustrated in the timing chart of FIG. 10, and thus no influence is exerted on the resultant image. Consequently, also in the solid-state imaging device according to Embodiment 2 of the present invention, in which a charge pump step-down circuit is used, occurrence of random horizontal line noise caused by a step-down operation performed by the charge pump step-down circuit can be suppressed.

As described above, in the solid-state imaging device according to Embodiment 2 of the present invention, random horizontal line noise which is caused by the operation of the charge pump step-up circuit and the charge pump step-down circuit and appears in an image can be effectively suppressed by using a control signal for the charge pump step-up circuit and the charge pump step-down circuit, and adding a simple logic circuit, and thus the time period during which the charge pump step-up circuit and the charge pump step-down circuit can be operated can be allocated as much as possible.

This means that it is not necessary to allocate time periods only for the step-up operation and the step-down operation of the charge pump step-up circuit and the charge pump step-down circuit, as respectively. In recent years, there has been an increasing demand for high speed imaging cameras, and thus the solid-state imaging device of the present invention, which enables high-speed reading with low noise is particularly promising.

Embodiment 3

Figure 11:
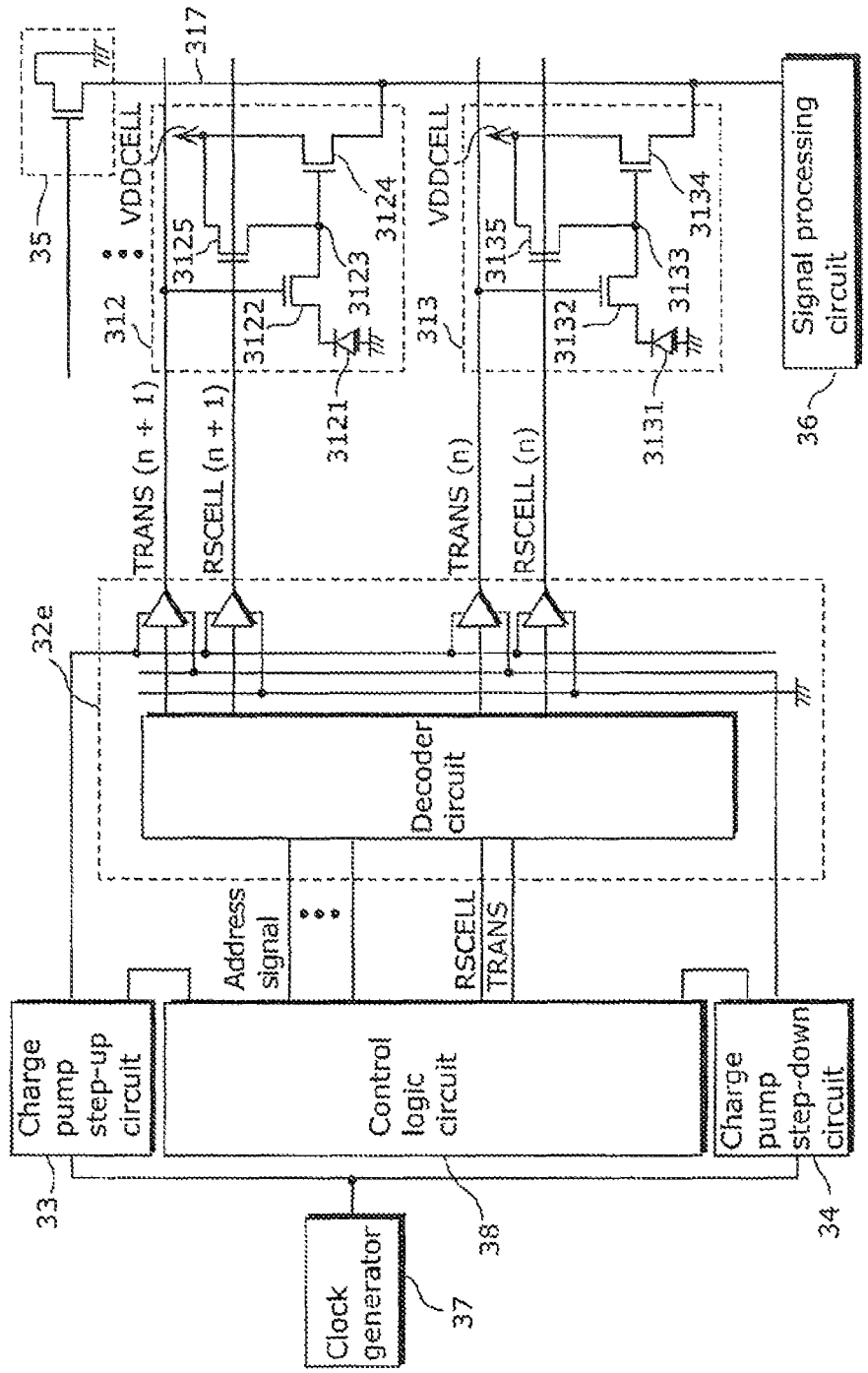
[FIG. 11]

Next, a solid-state imaging device according to Embodiment 3 of the present invention will be described with reference to FIGS. 11 to 13. FIG. 11 is a diagram illustrating the overall configuration of the solid-state imaging device according to Embodiment 3 of the present invention. It should be noted that only two pixel cells in an arbitrary pixel row are illustrated in the pixel array section illustrated in FIG. 11.

Figure 13:
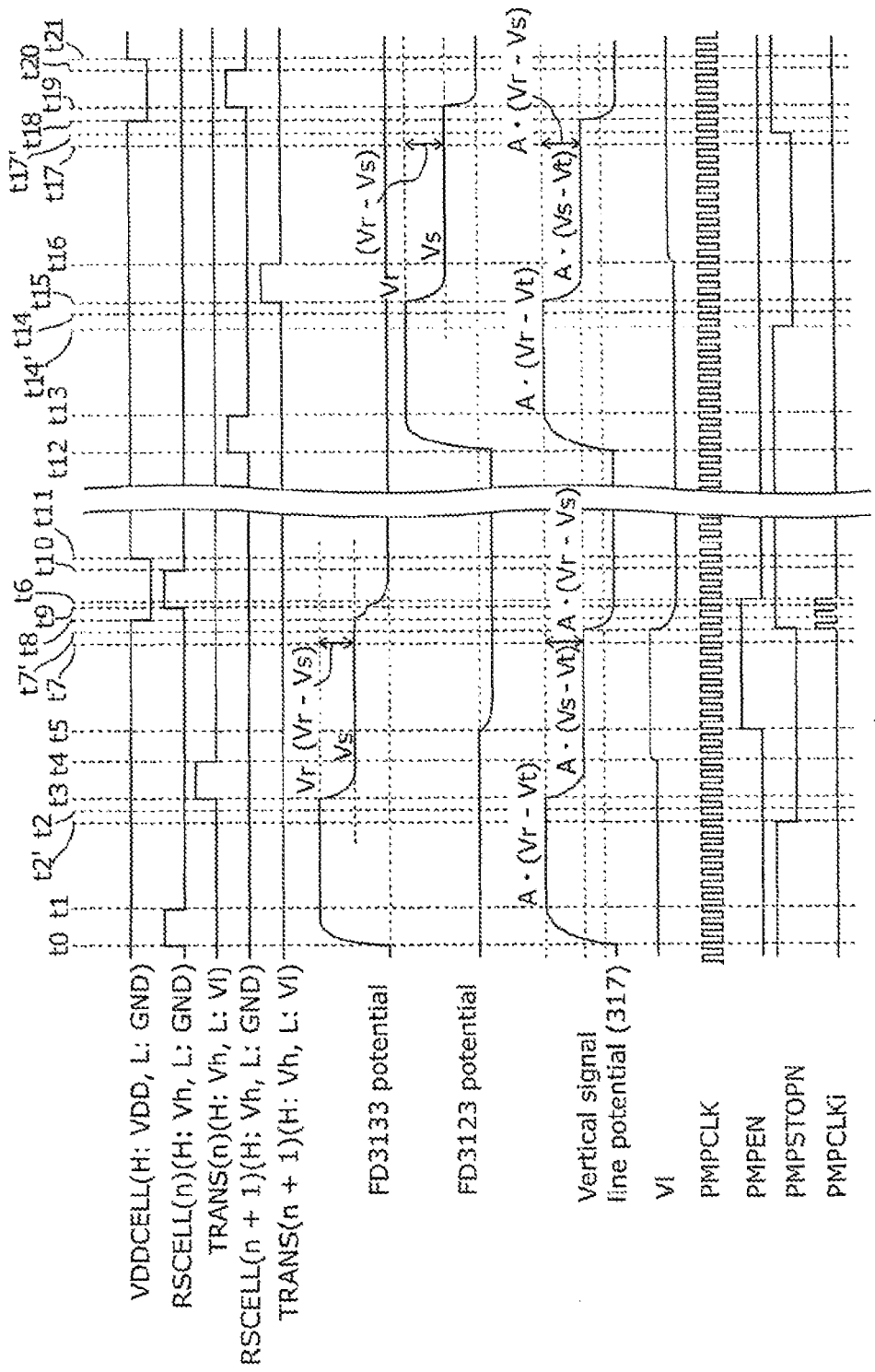
[FIG. 13]

The circuit configuration of the solid-state imaging device according to Embodiment 3 of the present invention illustrated in FIG. 13 is the same as that of the solid-state imaging device of Embodiment 1 or Embodiment 2 of the present invention illustrated in FIG. 3 with the pixel cell being replaced by the pixel cell illustrated in FIG. 9. In FIG. 11, the components having the same configuration as the components of the solid-state imaging device according to Embodiment 1 of the present invention illustrated in FIG. 3, are labeled with the same reference symbols, and description thereof is omitted.

As illustrated in FIG. 11, a pixel cell 312 in the pixel array section includes a photodiode 3121 as a photoelectric conversion unit; a charge detection unit FD3123 for converting a signal charge to a signal voltage, the signal charge being accumulated in the photodiode 3121; a transfer transistor 3122 for transferring the signal charge accumulated in the photodiode 3121 to the charge detection unit FD3123; an amplification transistor 3124 for amplifying the potential of the charge detection unit FD3123; and a reset transistor 3125 for resetting the potential of the charge detection unit FD3123 to a reset potential.

Similarly, a pixel cell 313 includes a photodiode 3131 as a photoelectric conversion unit, a charge detection unit FD3133, a transfer transistor 3132, and an amplification transistor 3134, a reset transistor 3135.

The output of the pixel cells in the same column is connected to the vertical signal line 317 in common.

The vertical scanning circuit 32e has a decoder circuit and a driver; and the address signals corresponding to the pixel rows to be driven, and the RSCELL signal and the TRANS signal which are driving pulse signals for driving selected pixel rows are supplied from the control logic circuit 38, while predetermined potentials are supplied from the charge pump step-up circuit 33 and the charge pump step-down circuit 34 so that the RSCELL signal and the TRANS signal for driving selected predetermined lines are outputted.

The pixel cells 312, 313 of the solid-state imaging device according to Embodiment 3 of the present invention illustrated in FIG. 11 respectively have the pixel configurations of the pixel cells 310, 311 of the solid-state imaging device according to Embodiment 1 of the present invention illustrated in FIG. 3 with the selection transistors 3106, 3116 constituting the pixel cells 310, 311 are removed therefrom, and thus the number of components of the pixel cells 312, 313 are reduced by the number of removed selection transistors, thereby providing an advantageous configuration for producing microscopic pixel cells. When pixel cells with the same size are compared, as the number of components of one pixel cell is decreased, the area of the photodiodes 3121, 3131 in the pixel cell can be increased, and thus sensitivity of the pixel cell can be improved.

Next, the principle of occurrence of the random horizontal line noise in a conventional solid-state imaging device, and the principle of suppression of the random horizontal line noise in the solid-state imaging device according to Embodiment 3 of the present invention will be described by taking the circuit configuration of FIG. 11 as an example with reference to FIGS. 12 and 13. For the solid-state imaging device according to Embodiment 3 of the present invention, only the random horizontal line noise caused by the operation of the charge pump step-down circuit is described. FIG. 12 is a timing chart for reading pixels of the n-th row and the (n+1)th row in the conventional solid-state imaging device using a charge pump step-down circuit. FIG. 13 is a timing chart for reading pixels of the n-th row and the (n+1)th row in the solid-state imaging device according to Embodiment 3 of the present invention, in which a charge pump step-down circuit is used.

First, the operation of the conventional solid-state imaging device using a charge pump step-down circuit will be described with reference to FIG. 12. In FIG. 12, VDDCELL indicates power source potential which is shared by the pixels, RSCELL(n) and TRANS(n) each indicate a control signal supplied to the pixel cells in the n-th row, and RSCELL(n+1) and TRANS(n+1) each indicate a control signal supplied to the pixel cells in the (n+1)th row. The potential of the charge detection unit FD3133 and the potential of the charge detection unit FD3123 indicate fluctuations in the potential of the charge detection unit FD3133 of the pixel cell 313 and the charge detection unit FD3123 of the pixel cell 312, respectively in the case where the same amount of light is incident to the pixel cells in the n-th row and the pixel cells in the (n+1)th row.

Figure 12:
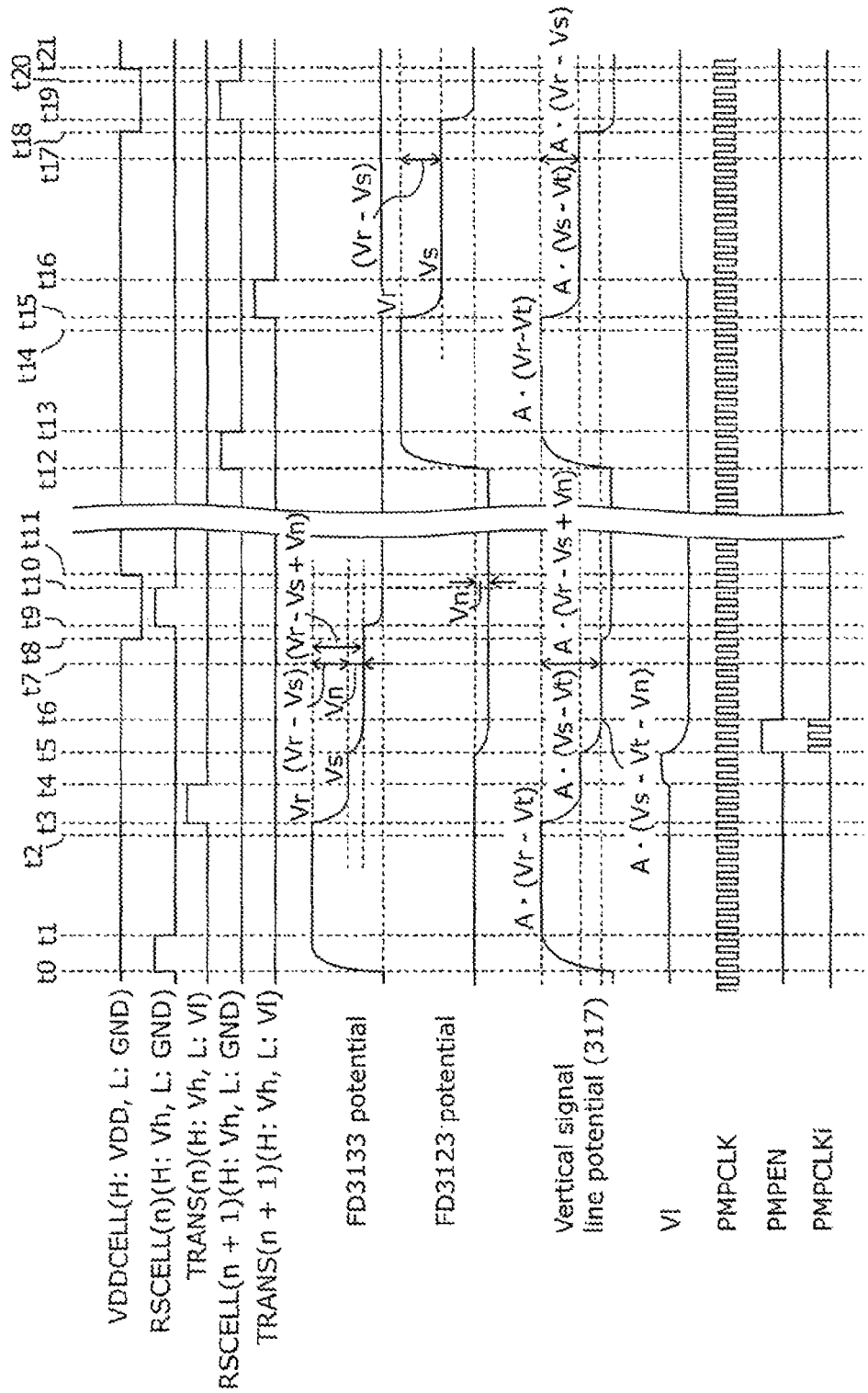
[FIG. 12]

In FIG. 12, the vertical signal line potential indicates the potential of the vertical signal line 317 to which the pixel cell 313 and the pixel cell 312 are connected. Vl indicates the output potential of the charge pump step-down circuit, i.e., the Low potential of the TRANS signal. PMPCLK indicates a driving clock signal generated by the clock generator 37. PMPEN indicates the output of the comparator 342 of the charge pump step-down circuit 34. PMPCLKi is a driving clock signal outputted to the pump unit 341 when PMPEN is Hi, and while PMPCLKi is inputted to the pump unit 341, the charge pump step-down circuit 34 performs a step-down operation.

In order to describe the generation principle of the random horizontal line noise resulting from charge pump step-down circuit 34 here, In time t5 within the pixel read period of eye n line, step-down voltage Vl exceeded the determination voltage, and the case where charge pump step-down circuit 34 performs step-down operation in the period by time t6 is assumed.

Hereinafter, the operation of the conventional solid-state imaging device using a charge pump step-down circuit will be described with reference to FIG. 12.

As illustrated in FIG. 12, in the present embodiment, the time period from t0 to t11 is the pixel reading time period for the n-th row, and the time period from t12 to t21 is the pixel reading time period for the (n+1)th row. At time t2, t14, the signal processing circuit 36 in the subsequent stage receives the first potential (pixel reset potential) for performing CDS processing, and at time t7, t17, the signal processing circuit 36 in the subsequent stage receives the second potential (pixel signal potential) for performing CDS processing. Thus, the differences between the potential of the vertical signal line 317 at time t2, t14 and the potential of the vertical signal line 317 at time t7, t17 indicate the signal outputs according to the amount of input light, respectively.

First, reading of the pixels in the n-th row will be described.

At the start time of pixel reading, the power source potential is supplied to VDDCELL. The charge detection units FD of all the pixels maintain the GND level.

At time t0, RSCELL(n) becomes Hi, and the potential of the charge detection unit FD3133 of the pixel cell 313 in the n-th row is reset to the reset potential Vr.

At time t1, RSCELL(n) becomes Low, and the charge detection unit FD3133 maintains the reset potential Vr. As described above, the amplification transistor 3134 and the current load circuit 35 together constitute a source follower amplifier, the potential of the vertical signal line 317 is simply expressed by $A \cdot (Vr-Vt)$ where the threshold voltage of the amplification transistor 3134 is Vt, and the gain of the source follower amplifier is A.

At time t2, the above-mentioned potential $A \cdot (Vr-Vt)$ of the vertical signal line 317 at time t2 is received by the signal processing circuit 36 in the subsequent stage.

Next, at time t3, TRANS(n) becomes Hi, the transfer transistor 3132 is turned on, and the electric charge accumulated in the photodiode 3131 is transferred to the charge detection unit FD3133, and thus the potential of the charge detection unit FD3133 becomes the potential Vs according to the transfer electric charge.

Next, in the time period time t5 to time t6, the charge pump step-down circuit 34 performs a step-down operation, and the potential of Vl is decreased. For this reason, Low potential of TRANS(n) is also decreased, and the charge detection unit FD3133 is decreased to a potential lower than the original potential Vs due to coupling with the signal line TRANS(n). Here, assuming that the decreased amount in the charge detection unit FD3133 is Vn, the potential of the charge detection unit FD3133 is (Vs−Vn) at time t7 when the signal processing circuit 36 in the subsequent stage receives the second potential for performing CDS processing. The potential of the vertical signal line 317 at time t7 is then $A \cdot (Vs-Vn-Vt)$. Consequently, the signal output of the pixels in the n-th row is the difference between the potential of the vertical signal line 317 at time t2 and the potential of the vertical signal line 317 at time t7, and thus is $A \cdot (Vr-Vs+Vn)$.

Subsequently, VDDCELL becomes the GND level at time t8, and RSCELL(n) becomes Hi again at time t9, and thus the potential of the charge detection unit FD3133 is reset to the GND level.

At time t10, RSCELL(n) becomes Low, and the charge detection unit FD3133 maintains the GND level.

Finally, at time t11, VDDCELL becomes VDD potential.

Next, reading of the pixels in the (n+1)th row will be described.

At time t12, RSCELL(n+1) becomes Hi, and the potential of the charge detection unit FD3123 of the pixel cell 312 in the (n+1)th row is reset to the reset potential Vr.

At time t13, RSCELL(n+1) becomes Low, and the charge detection unit FD3123 maintains the reset potential Vr. As described above, the amplification transistor 3124 and the current load circuit 35 together constitute a source follower amplifier, the potential of the vertical signal line 317 is simply expressed by $A \cdot (Vr-Vt)$ where the threshold voltage of the amplification transistor 3124 is Vt, and the gain of the source follower amplifier is A.

At time t14, the above-mentioned potential $A \cdot (Vr-Vt)$ of the vertical signal line 317 is received by the signal processing circuit 36 in the subsequent stage.

Next, at time t15, TRANS(n+1) becomes Hi, the transfer transistor 3122 is turned on, and the electric charge accumulated in the photodiode 3121 is transferred to the charge detection unit FD3123, and thus the potential of the charge detection unit FD3123 becomes the potential Vs according to the transfer electric charge.

Therefore, the potential of the charge detection unit FD3123 is Vs at time t17 when the signal processing circuit 36 in the subsequent stage receives the second potential for performing CDS processing, and the potential of the vertical signal line 317 at time t17 is $A \cdot (Vs-Vt)$. Consequently, the signal output of the pixels in the (n+1)th row is the difference between the potential of the vertical signal line 317 at time t14 and the potential of the vertical signal line 317 at time t17, and thus is $A \cdot (Vr-Vs)$.

Subsequently, VDDCELL becomes the GND level at time t18, and RSCELL(n+1) becomes Hi again at time t19, and thus the potential of the charge detection unit FD3123 is reset to the GND level.

At time t20, RSCELL(n+1) becomes Low, and the charge detection unit FD3123 maintains the GND level.

At time t21, VDDCELL becomes VDD potential.

As described above, in the conventional solid-state imaging device using a charge pump step-up circuit, the noise component of $A \cdot Vn$ is uniformly added to the signal output of the pixels in the n-th row, on which a step-down operation is performed by the charge pump step-down circuit 34 during the pixel reading time period, and thus horizontal line noise occurs. The noise component Vn added to the charge detection unit FD varies for each row to be read, and thus appears in an image as random horizontal line noise. It should be noted that the above-described example of the (n+1)th row is the case of Vn=0.

Next, the operation of the solid-state imaging device according to Embodiment 3 of the present invention, in which the charge pump step-down circuit 34 is used will be described with reference to FIG. 13.

In FIG. 13, VDDCELL indicates power source potential which is shared by the pixels, RSCELL(n) and TRANS(n) each indicate a control signal supplied to the pixels in the n-th row, and RSCELL(n+1) and TRANS(n+1) each indicate a control signal supplied to the pixels in the (n+1)th row.

In FIG. 13, the potential of the charge detection unit FD3133 and the potential of the charge detection unit FD3123 indicate fluctuations in the potential of the charge detection unit FD3133 of the pixel cell 313 and the charge detection unit FD3123 of the pixel cell 312, respectively in the case where the same amount of light is incident to the pixels in the n-th row and the pixels in the (n+1)th row. The vertical signal line potential indicates the potential of the vertical signal line 317 to which the pixel cell 313 and the pixel cell 312 are connected. Vl indicates the output potential of the charge pump step-down circuit 34, i.e., the Low potential of the TRANS signal. PMPCLK indicates a driving clock signal generated by the clock generator 37. PMPEN indicates the output of the comparator 342 of the charge pump step-down circuit 34. PMPSTOPN is an enable signal of the charge pump step-down circuit 34, and is a driving clock stop control signal for stopping the PMPCLK supplied from the clock generator 37 during the reading time period of each pixel row. When PMPSTOPN is Low, PMPCLK is caused to be stopped, and when PMPSTOPN is Hi, PMPCLK is caused to resume. PMPCLKi is a driving clock signal outputted to the pump unit 341 when PMPEN is Hi and PMPSTOPN is Hi, and the charge pump step-down circuit 34 performs a step-down operation while PMPCLKi is inputted to the pump unit 341. That is to say, in a time period while PMPSTOPN signal is Low, the driving clock PMPCLKi supplied to the pump unit 341 of the charge pump step-down circuit 34 is fixed to Low, and thus the charge pump step-down circuit 34 does not perform step-down operation.

In order to describe the principle of suppression of the random horizontal line noise caused by the charge pump step-down circuit 34 herein, similarly to the above-described conventional solid-state imaging device, a case is assumed where the step-down voltage Vl exceeds a determination voltage at time t5 in the pixel reading time period for the n-th row, and the PMPEN signal outputted by the comparator 342 of the charge pump step-down circuit 34 becomes Hi.

Next, the operation of the solid-state imaging device according to Embodiment 3 of the present invention, in which a charge pump step-down circuit is used will be described with reference to FIG. 13.

As illustrated in FIG. 13, in the present embodiment, the time period from t0 to t11 is the pixel reading time period for the n-th row, and the time period from t12 to t21 is the pixel reading time period for the (n+1)th row. At time t2, t14, the signal processing circuit 36 in the subsequent stage receives the first potential (pixel reset potential) for performing CDS processing, and at time t7, t17, the signal processing circuit 36 in the subsequent stage receives the second potential (pixel signal potential) for performing CDS processing. Thus, the differences between the potential of the vertical signal line 317 at time t2, t14 and the potential of the vertical signal line 317 at time t7, t17 indicate the signal outputs according to the amount of input light, respectively. Fall times of PMPSTOPN signal, t2' and t14' are respectively between time t0, t12 and time t2, t14 at which the signal processing circuit 36 in the subsequent stage receives the first potential for performing CDS processing, and rise times of PMPSTOPN signal, t7' and t17' are respectively between time t7, t17 and time t11, t21, where the signal processing circuit 36 in the subsequent stage receives the second potential for performing CDS processing at t7, t17, and a pixel reading time period expires at t11, t21.

First, reading of the pixels in the n-th row will be described.

At the start time of pixel reading, the power source potential is supplied to VDDCELL. The charge detection units FD of all the pixel cells maintain the GND level.

At time t0, RSCELL(n+1) becomes Hi, and the potential of the charge detection unit FD3133 of the pixel cell 313 in the (n+1)th row is reset to the reset potential Vr.

At time t1, RSCELL(n) becomes Low, and the charge detection unit FD3133 maintains the reset potential Vr. As described above, the amplification transistor 3134 and the current load circuit 35 together constitute a source follower amplifier, the potential of the vertical signal line 317 is simply expressed by A·(Vr−Vt) where the threshold voltage of the amplification transistor 3134 is Vt, and the gain of the source follower amplifier is A.

At time t2, the above-mentioned potential A·(Vr−Vt) of the vertical signal line 317 is received by the signal processing circuit 36 in the subsequent stage.

Next, at time t3, TRANS(n) becomes Hi, the transfer transistor 3132 is turned on, and the electric charge accumulated in the photodiode 3131 is transferred to the charge detection unit FD3133, and thus the potential of the charge detection unit FD3133 becomes the potential Vs according to the transfer electric charge.

Although the PMPEN signal becomes Hi at time t5, the driving clock signal PMPCLKi supplied to the pump unit 341 of the charge pump step-down circuit 34 is fixed to Low because PMPSTOPN signal is Low, and thus the pump unit 341 does not perform a step-down operation. Consequently, the noise component Vn according to Vl fluctuation is not added to the charge detector FD3133 like the conventional solid-state imaging device described with reference to FIG. 12.

Therefore, the potential of the charge detection unit FD3133 is Vs at time t7 when the signal processing circuit 36 in the subsequent stage receives the second potential for performing CDS processing, and the potential of the vertical signal line 317 at time t7 is A·(Vs−Vt). Consequently, the signal output of the pixels in the n-th row is A·(Vr−Vs).

Subsequently, VDDCELL becomes the GND level at time t8, and RSCELL(n) becomes Hi again at time t9, and thus the potential of the charge detection unit FD3133 is reset to the GND level.

At time t10, RSCELL(n) becomes Low, and the charge detection unit FD3133 maintains the GND level.

At time t11, VDDCELL becomes VDD potential.

PMPSTOPN signal becomes Hi at time t7' which is between time t7 and time t11 where the signal processing circuit 36 in the subsequent stage receives the second potential for performing CDS processing at time t7, and a pixel signal reading time period expires at time t11, and the PMPCLK signal is transmitted to the driving clock signal PMPCLKi which is supplied to the pump unit 341 of the charge pump step-down circuit 34. Accordingly, the charge pump step-down circuit 34 starts a step-down operation, and when generated potential reaches a desired potential, the charge pump step-down circuit 34 stops the step-down operation.

Next, reading of the pixels in the (n+1)th row will be described.

At time t12, RSCELL(n+1) becomes Hi, and the potential of the charge detection unit FD3123 of the pixel cell 312 in the (n+1)th row is reset to the reset potential Vr.

At time t13, RSCELL(n+1) becomes Low, and the charge detection unit FD3123 maintains the reset potential Vr. As described above, the amplification transistor 3124 and the current load circuit 35 together constitute a source follower amplifier, the potential of the vertical signal line 317 is simply expressed by A·(Vr−Vt) where the threshold voltage of the amplification transistor 3124 is Vt, and the gain of the source follower amplifier is A.

At time t14, the above-mentioned potential A·(Vr−Vt) of the vertical signal line 317 is received by the signal processing circuit 36 in the subsequent stage.

Next, at time t15, TRANS(n) becomes Hi, the transfer transistor 3122 is turned on, and the electric charge accumulated in the photodiode 3121 is transferred to the charge detection unit FD3123, and thus the potential of the charge detection unit FD3123 becomes the potential Vs according to the transfer electric charge. In this manner, PMPSTOPN is fixed to Low during the reading time period for the (n+1)th row, and thus a driving clock signal is not inputted to the pump unit 341 during the time period, and consequently the pump unit 341 does not perform a step-down operation. Therefore, the potential of the charge detection unit FD3123 is Vs at time t17 when the signal processing circuit 36 in the subsequent stage receives the second potential for performing CDS processing, and the potential of the vertical signal line 317 at time t17 is A·(Vs−Vt). Consequently, the signal output of the pixels in the (n+1)th row is the difference between the potential of the vertical signal line 317 at time t14 and the potential of the vertical signal line 317 at time t17, and thus is A·(Vr−Vs).

Subsequently, VDDCELL becomes the GND level at time t18, and RSCELL(n+1) becomes Hi again at time t19, and thus the potential of the charge detection unit FD3123 is reset to the GND level.

At time t20, RSCELL(n+1) becomes Low, and the charge detection unit FD3123 maintains the GND level.

At time t21, VDDCELL becomes VDD potential.

As described above, the solid-state imaging device according to Embodiment 3 of the present invention using charge pump step-down circuit causes a step-down operation of the charge pump step-down circuit to be stopped during each pixel reading time period by the PMPSTOPN signal generated by the control logic circuit 38, the step-down operation causing a step-down of Low potential of the gate input signal line of the transistors which constitutes a pixel cell. Accordingly, the fluctuation in the above-mentioned Low potential of the gate input signal line in the pixel reading time period can be prevented from being varied for each row of pixels to be read. Therefore, an offset voltage applied to the charge detection unit FD by the parasitic capacitance between the signal lines for driving the transistors in a pixel cell and the charge detection unit FD can be prevented from being varied for each row to be read. In this manner, unlike the conventional solid-state imaging device, the solid-state imaging device according to Embodiment 3 of the present invention prevents the noise component of A·Vn from being added to the signal output of the pixels in the nth row during each pixel reading time period, and thus random horizontal line noise caused by a fluctuation in the output potential of the charge pump step-down circuit can be suppressed, and thus a high quality image can be obtained.

Because the solid-state imaging device according to Embodiment 3 of the present invention has no selection transistor in each pixel cell, the drains of the amplification transistors of the pixel cells in all rows are connected to the vertical signal line, and thus the parasitic capacitances between the gate and drains of the amplification transistors causes the fluctuation in each charge detection unit FD to be transmitted to the vertical signal line.

Therefore, in the conventional solid-state imaging device, a fluctuation in the output potential Vl of the charge pump step-down circuit in the time period from time t5 to time t6 causes a significant variation in the vertical signal line as illustrated in FIG. 12. For this reason, the potential of the vertical signal line remains unstable until time t7 when the signal processing circuit in the subsequent stage receives the second potential for performing CDS processing, and thus random noise appears in the image. On the other hand, such a problem does not occur in the solid-state imaging device according to Embodiment 3 of the present invention.

Embodiment 4

Figure 14:
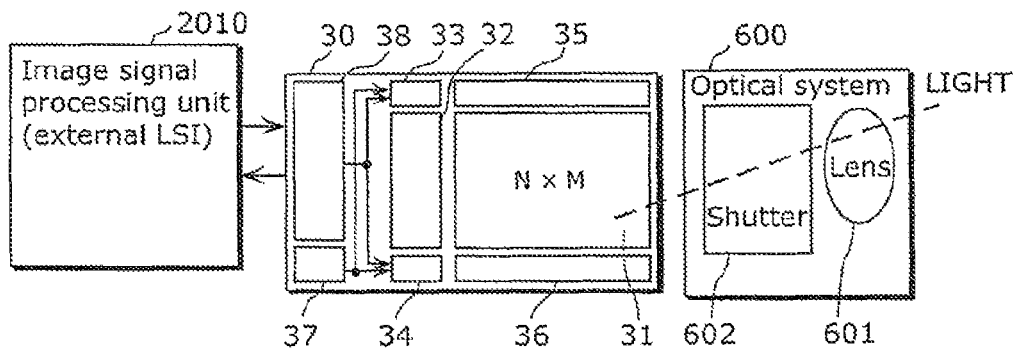
[FIG. 14]

Next, an imaging apparatus according to Embodiment 4 of the present invention will be described with reference to FIG. 14. FIG. 14 is a block diagram illustrating the configuration of the imaging device (camera) according to Embodiment 4 of the present invention.

As illustrated in FIG. 14, the imaging apparatus according to Embodiment 4 of the present invention includes an optical system 600, an image signal processing unit 2010 which is constituted by an external LSI or the like, and the above-described solid-state imaging device 30 according to Embodiments 1 to 3 of the present invention.

The optical system 600 includes a lens 601 which focuses the light from a subject onto an imaging area of the solid-state imaging device so as to form an image, and a mechanical shutter 602 which is located on the optical path between the lens 601 and the solid-state imaging device, and controls the amount of light received on the imaging area.

In the above, the present invention has been illustrated based on Embodiments 1 to 4, however, the present invention is not limited to these embodiments.

For example, the present invention can be applied not only to the pixel configuration of the solid-state imaging device in the above-described embodiments, but also to any pixel configuration in which the transistors in the pixel cell are each driven by a potential generated by a charge pump step-up circuit or a charge pump step-down circuit.

In addition, the present invention can be applied to a pixel configuration in which a single pixel cell has a plurality of photodiodes and transfer transistors.

Furthermore, the control logic circuit for stopping driving clocks of the charge pump step-up circuit and the charge pump step-down circuit may be included in the control logic circuit in the present embodiment.

A configuration may be made such that the solid-state imaging device in Embodiments 1 to 3 of the present invention includes a frequency multiplier circuit or a frequency divider circuit so that a driving clock signal is generated by the frequency multiplier circuit or the frequency divider circuit.

In the present embodiment, the charge pump step-up circuit performs a step-up operation in relation to the selection control signal (SEL signal), the reset signal (RSCELL signal), and the transfer control signal (TRANS signal), however, the charge pump step-up circuit may perform a step-up operation in relation to any one or any two of the selection control signal, the reset signal, and the transfer control signal.

In the present embodiment, the charge pump step-down circuit performs a step-down operation in relation to the transfer control signal (TRANS signal), however, the invention is not limited to this case. For example, the charge pump step-down circuit may perform a step-down operation in relation to the selection control signal (SEL signal) or the reset signal (RSCELL signal). Optionally, the charge pump step-down circuit may perform a step-down operation in relation to all of the selection control signals, the reset signals, and the transfer control signal.

In addition, in a scope not departing from the gist of the present invention, embodiments to which various modifications that occur to those skilled in the art are made are also included in the scope of the present invention. In addition, in a scope not departing from the spirit of the present invention, the components in a plurality of embodiments may be arbitrarily combined.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The solid-state imaging device according to the present invention can be utilized as a solid-state imaging device such as a camera, and particularly as a MOS solid-state imaging device.

The invention claimed is:

1. A solid-state imaging device, comprising:
   a pixel cell including:
      a light receiving unit configured to convert incident light to a signal charge,
      a charge detection unit configured to convert, to a signal voltage, the signal charge transferred from said light receiving unit,
      an amplification transistor which amplifies the signal voltage, a transfer transistor which transfers, to said charge detection unit, the signal charge accumulated in said light receiving unit, in accordance with a transfer control signal, and a reset transistor which resets a potential of said charge detection unit to a reset potential in accordance with a reset control signal;

a signal processing circuit which receives a pixel reset potential corresponding to the reset potential of said charge detection unit, and a pixel signal potential corresponding to the signal charge transferred to said charge detection unit;

a charge pump circuit which steps up or steps down a potential of at least one of the transfer control signal and the reset control signal in accordance with a driving clock signal; and a control circuit which causes the driving clock signal to be stopped during a pixel reading time period in which the reset potential and the pixel signal potential are read.

2. The solid-state imaging device according to claim 1, wherein said charge pump circuit steps up the potential of at least one of the transfer control signal and the reset control signal to a potential higher than a power source potential.

3. The solid-state imaging device according to claim 2, wherein said pixel cell further includes a selection transistor which selects a pixel cell to be read, in accordance with a selection control signal, and said charge pump circuit steps up a potential of the selection control signal.

4. The solid-state imaging device according to claim 2, further comprising a capacitive element connected to an output of said charge pump circuit.

5. The solid-state imaging device according to claim 1, wherein said charge pump circuit steps down the potential of at least one of the transfer control signal and the reset control signal to a potential lower than a ground potential.

6. The solid-state imaging device according to claim 5, wherein said pixel cell further includes a selection transistor which selects a pixel cell to be read, in accordance with a selection control signal, and said charge pump circuit steps down a potential of the selection control signal.

7. The solid-state imaging device according to claim 5, further comprising a capacitive element connected to an output of said charge pump circuit.

8. The solid-state imaging device according to claim 3, wherein the pixel reading time period is a time period in which said pixel cell is selected by said selection transistor.

9. The solid-state imaging device according to claim 1, wherein said control circuit causes the driving clock signal to be stopped in a time period including a time interval from a time when said signal processing circuit receives the pixel reset potential to a time when said signal processing circuit receives the pixel signal potential.

10. The solid-state imaging device according to claim 1, further comprising a frequency multiplier circuit or a frequency divider circuit, wherein the driving clock signal is generated by said frequency multiplier circuit or said frequency divider circuit.

11. An imaging apparatus comprising
the solid-state imaging device according to claim 1.

* * * * *